US012666922B2

(12) United States Patent
Lee et al.

(10) Patent No.: US 12,666,922 B2
(45) Date of Patent: Jun. 23, 2026

(54) APPARATUS FOR FABRICATING DISPLAY PANEL AND FABRICATING METHOD THEREOF

(71) Applicant: SAMSUNG DISPLAY CO., LTD., Yongin-si (KR)

(72) Inventors: Tae Hee Lee, Yongin-si (KR); Min Woo Kim, Yongin-si (KR); Sung Kook Park, Yongin-si (KR); Jae Gwang Um, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 377 days.

(21) Appl. No.: 18/357,942

(22) Filed: Jul. 24, 2023

(65) Prior Publication Data

US 2024/0120230 A1      Apr. 11, 2024

(30) Foreign Application Priority Data

Oct. 11, 2022   (KR) ........................ 10-2022-0130066
Nov. 23, 2022   (KR) ........................ 10-2022-0157888

(51) Int. Cl.
  *H01L 21/78*       (2006.01)
  *H10H 29/14*       (2025.01)
  *H10P 72/70*       (2026.01)
(52) U.S. Cl.
  CPC ........... *H10P 72/74* (2026.01); *H10H 29/142* (2025.01); *H10P 72/7428* (2026.01); *H10P 72/7432* (2026.01); *H10P 72/744* (2026.01)
(58) Field of Classification Search
  CPC ....... H01L 21/6835; H01L 2221/68354; H01L 2221/68363; H01L 2221/68381; H01L 25/0753; H10H 29/142; H10H 20/01

USPC ............................................................ 438/35
See application file for complete search history.

(56) References Cited

U.S. PATENT DOCUMENTS 6,287,891 B1 *  9/2001  Sayyah .................... H05K 3/20
                                                        438/455
6,338,980 B1 *  1/2002  Satoh .................... H01L 21/568
                                                        257/E29.022
6,518,677 B1 *  2/2003  Capote ................ H01L 23/4334
                                                        257/E21.511
6,981,317 B1 *  1/2006  Nishida .................. H01L 24/29
                                                        257/E21.511

(Continued)

FOREIGN PATENT DOCUMENTS

KR     10-2018-0118488 A     10/2018

*Primary Examiner* — Vu A Vu
(74) *Attorney, Agent, or Firm* — Womble Bond Dickinson (US) LLP

(57)      ABSTRACT

An apparatus for fabricating a display panel and a fabricating method of a display panel are provided. An apparatus for fabricating a display panel includes a loading module of a large-area fabricating substrate fabricated and separated into a plurality of display panels, a solvent application module configured to apply a metal bonding solvent onto the large-area fabricating substrate, and an element transfer module configured to transfer a plurality of light emitting elements or at least one integrated circuit onto the large-area fabricating substrate on which the metal bonding solvent is applied, and the loading module includes a groove type discharge path through which the metal bonding solvent applied by the solvent application module flows and is discharged.

20 Claims, 26 Drawing Sheets

(56)          References Cited

U.S. PATENT DOCUMENTS

| 7,531,906 | B2 * | 5/2009 | Lee | H01L 24/81 |
| | | | | 257/734 |
| 7,743,493 | B2 * | 6/2010 | Uchikoba | H01C 7/003 |
| | | | | 29/831 |
| 9,263,414 | B2 * | 2/2016 | Yeo | B23K 1/0016 |
| 10,685,901 | B2 * | 6/2020 | Hiyoshi | F28D 15/046 |
| 10,753,551 | B2 * | 8/2020 | Hasegawa | H01L 24/05 |
| 11,140,788 | B2 * | 10/2021 | Tanaka | B23K 1/0016 |
| 11,251,166 | B2 * | 2/2022 | Schuele | H10H 20/8506 |
| 2017/0309698 | A1 | 10/2017 | Bower et al. | |

* cited by examiner

510

APPARATUS FOR FABRICATING DISPLAY PANEL AND FABRICATING METHOD THEREOF

CROSS-REFERENCE TO RELATED APPLICATIONS

This application claims priority to and the benefit of each of Korean Patent Application No. 10-2022-0130066, filed on Oct. 11, 2022 in the Korean Intellectual Property Office, and Korean Patent Application No. 10-2022-0157888, filed on Nov. 23, 2022 in the Korean Intellectual Property Office, the entire contents of both of which are herein incorporated by reference.

BACKGROUND

1. Field

Aspects of embodiments of the present disclosure relate to an apparatus for fabricating a display panel and a fabricating method thereof.

2. Description of the Related Art

The importance of display devices has steadily increased with the development of multimedia technology. In response thereto, various types of display devices, such as an organic light emitting display (OLED), a liquid crystal display (LCD) and the like have been used.

A display device is a device for displaying an image, and includes a display panel, such as a light emitting display panel or a liquid crystal display panel. Among them, the light emitting display panel may include a light emitting diode (LED), and the light emitting diode includes an organic light emitting diode using an organic material as a fluorescent material or an inorganic light emitting diode using an inorganic material as a fluorescent material.

In fabricating a display panel using an inorganic light emitting diode as a light emitting element, fabricating apparatuses for accurately arranging and transferring light emitting diodes such as micro LEDs onto a substrate of the display panel are used.

SUMMARY

According to aspects of embodiments of the present disclosure, an apparatus for fabricating a display panel, which is capable of precisely and accurately transferring light emitting diodes, and a fabricating method thereof, are provided.

According to aspects of embodiments of the present disclosure, an apparatus for fabricating a display panel, which is capable of preventing or substantially preventing uneven flow and uneven thickness change of metal bonding solvent by allowing metal bonding solvent such as flux applied on a display substrate to be easily discharged through a groove-type discharge passage, and a fabricating method thereof, are provided.

However, aspects of the present disclosure are not limited to those set forth herein. The above and other aspects of the present disclosure will become more apparent to one of ordinary skill in the art to which the present disclosure pertains by referencing the description of some embodiments of the present disclosure provided below.

According to one or more embodiments of the present disclosure, an apparatus for fabricating a display panel comprises a loading module of a large-area fabricating substrate fabricated and separated into a plurality of display panels, a solvent application module configured to apply a metal bonding solvent onto the large-area fabricating substrate, and an element transfer module configured to transfer a plurality of light emitting elements or at least one integrated circuit onto the large-area fabricating substrate on which the metal bonding solvent is applied, wherein the loading module comprises a groove type discharge path through which the metal bonding solvent applied by the solvent application module flows and is discharged.

In an embodiment, the groove type discharge path comprises a plurality of linear flow grooves forming a flow path of the metal bonding solvent, and a plurality of discharge grooves to discharge the metal bonding solvent flowing through the plurality of linear flow grooves.

In an embodiment, the groove type discharge path further comprises a plurality of discharge grooves formed in a lower or side direction of the plurality of discharge grooves to discharge the metal bonding solvent in the lower or side direction.

In an embodiment, the plurality of discharge grooves are formed on an end and an opposite end of each of the plurality of linear flow grooves, and the plurality of discharge grooves are formed to pass through each of the plurality of discharge grooves in the lower direction or the side direction.

In an embodiment, the apparatus further includes a storage container having a collecting space on the lower, rear surface or side surface of the loading module so as to correspond to the passing direction of a discharge groove formed respectively in the plurality of discharge grooves.

In an embodiment, the plurality of linear flow grooves are formed respectively in the first and second directions of a loading surface of the loading module and some areas intersect in the first and second directions to coincide or overlap with each other.

In an embodiment, the plurality of linear flow grooves are additionally formed on an outer edge of the loading surface in a same shape as an outer edge shape of the loading surface corresponding to the area and outer edge shape of the loading surface of the loading module.

In an embodiment, the plurality of linear flow grooves are additionally formed on the outer edge of the loading surface in a shape surrounding the outer edge of the loading surface larger than the area of the loading surface of the loading module.

In an embodiment, the plurality of linear flow grooves are formed in a straight or curved shape, formed in a mesh type by crossing each other, and formed in a plurality of separate forms.

In an embodiment, cross-sections of the plurality of linear flow grooves are formed in a V-shape or U-shape, and the metal bonding solvent is filled into the plurality of linear flow grooves and the metal bonding solvent flows along the longitudinal direction of the linear flow grooves.

In an embodiment, each of the plurality of linear flow grooves are formed to have a gradient, and the plurality of linear flow grooves are formed to have a highest gradient at a center of the loading surface and a lowest gradient closer to an edge of the loading surface.

In an embodiment, the large-area fabricating substrate comprises a plurality of groove lines forming a flow path of the metal bonding solvent applied onto the front surface of the large-area fabricating substrate.

In an embodiment, the plurality of groove lines are formed in first and second directions of the front surface of the large-area fabricating substrate and some areas intersect in the first and second directions to coincide or overlap each other.

In an embodiment, the plurality of groove lines are formed in a straight shape, formed in a mesh type by crossing each other, and formed in a plurality of separate forms.

In an embodiment, the plurality of groove lines are formed respectively at a positions overlapping the plurality of linear flow grooves formed in the loading module to correspond respectively between a plurality of discharge grooves formed in the loading module.

In an embodiment, the element transfer module comprises a transfer member in which a pressing header is fixed to a fixing portion of a pressing direction, a transfer driving member to move the transfer member and the pressing header in the pressing direction or a detaching direction using a fixing frame of the transfer member, a pressure sensing module between the pressing header and the transfer member to generate pressure detection signals according to the pressure applied to the pressing header, a gradient setting module to set a gradient of the pressing header based on a magnitude of the pressure detection signals, and a gradient control module to control the gradients of the pressing header, the transfer member and the fixing frame according to a control of the gradient setting module.

In an embodiment, the pressure sensing module uses a plurality of pressure sensors disposed in each different position in different directions to sense the magnitude of the pressure applied to the pressing header and generate pressure sensing signals based on the magnitude of the pressure, and the pressure sensing module uses at least one signal transmission circuit to transmit the pressure detection signals with the directional code in respect to each of the plurality of pressure sensors to the gradient setting module.

In an embodiment, the gradient setting module detects a magnitude deviation between the pressure detection signals and calculates horizontal gradient setting values of the pressing header for making the magnitude deviation between the pressure detection signals zero, and generates gradient control signals corresponding to magnitudes of the calculated horizontal gradient setting values to transmit the gradient control signals to the gradient control module.

In an embodiment, the gradient control module adjusts horizontal gradients of a plurality of pressure controllers, the transfer member, and the pressing header formed on a flat plate type support frame by controlling the horizontal gradient of the flat plate type support frame of the transfer driving member based on the gradient control signals.

According to one or more embodiments of the present disclosure, a fabricating method of a display panel comprises loading, onto a loading module, a large-area fabricating substrate fabricated and separated into a plurality of display panels, applying a metal bonding solvent onto the large-area fabricating substrate using a solvent application module, and transferring a plurality of light emitting elements or at least one integrated circuit on the large-area fabricating substrate applied with the metal bonding solvent using an element transfer module, wherein, before transferring the light emitting elements or the at least one integrated circuit, the metal bonding solvent applied on the large-area fabricating substrate flows and is discharged through a groove type discharge path formed in the loading module.

According to an aspect, in accordance with the apparatus for fabricating a display device according to one or more embodiments, a fabricating efficiency of the display panel may be improved and a reliability may be improved by precisely and accurately arranging and transferring light emitting diodes onto the display substrate.

Further, by allowing the metal bonding solvent which is applied on the display substrate such that the light emitting diodes are bonded to a display substrate to be uniformly and easily discharged through the groove type discharge passage, it is possible to minimize or reduce a transfer defect rate of the light emitting diodes and reduce a fabrication cost.

However, aspects and effects according to the embodiments of the present disclosure are not limited to those discussed above, and various other aspects and effects are incorporated herein.

BRIEF DESCRIPTION OF THE DRAWINGS

The above and other aspects and features of the present disclosure will become more apparent by describing in further detail some embodiments thereof with reference to the attached drawings, in which.

DETAILED DESCRIPTION

The present invention will now be described more fully herein with reference to the accompanying drawings, in which some example embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art.

It is also to be understood that when a layer is referred to as being "on" another layer or substrate, it may be directly on the other layer or substrate, or one or more intervening layers may also be present. The same reference numbers indicate the same components throughout the specification.

It is to be understood that, although the terms "first," "second," etc. may be used herein to describe various elements, these elements should not be limited by these terms. These terms are used to distinguish one element from another element. For instance, a first element discussed below could be termed a second element without departing from the teachings of the present invention. Similarly, the second element could also be termed the first element.

Each of the features of the various embodiments of the present disclosure may be combined or combined with each other, in part or in whole, and technically various interlocking and driving are possible. Each embodiment may be implemented independently of each other or may be implemented together in an association.

Unless otherwise defined, all terms (including technical and scientific terms) used herein have the same meaning as commonly understood by one of ordinary skill in the art to which the inventive concept pertains. It is also to be understood that terms defined in commonly used dictionaries should be interpreted as having meanings consistent with the meanings in the context of the related art, and they are not interpreted in an ideal or overly formal sense, unless expressly defined herein.

Herein, embodiments will be described in further detail with reference to the accompanying drawings.

Figure 1:
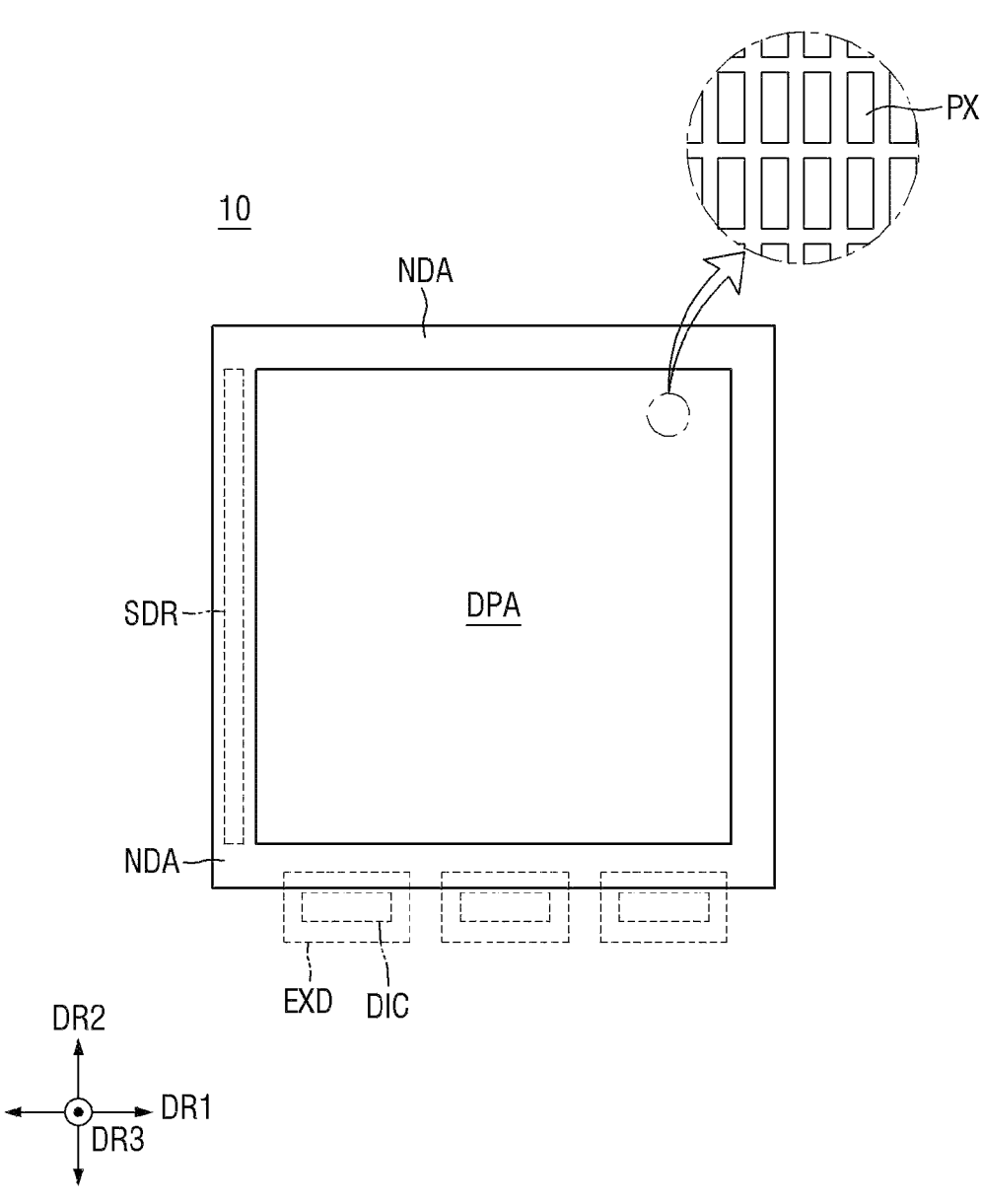
FIG. 1 is a plan view of a display device according to an embodiment of the present disclosure.

FIG. 1 is a plan view of a display device according to an embodiment of the present disclosure.

Referring to FIG. 1, a display device 10 according to an embodiment may be applied to a smartphone, a mobile phone, a tablet PC, a personal digital assistant (PDA), a portable multimedia player (PMP), a television, a game machine, a wristwatch-type electronic device, a head-mounted display, a monitor of a personal computer, a laptop computer, a car navigation system, a car dashboard, a digital camera, a camcorder, an external billboard, an electronic billboard, a medical device, an inspection device, various household appliances, such as a refrigerator and a washing machine, or an Internet-of-Things device. Herein, a television (TV) is described as an example of a display device, and the TV may have a high resolution or an ultra high resolution, such as any of HD, UHD, 4K, and 8K.

In addition, the display device 10 according to an embodiment may be classified into various types according to a display method. Examples of the display device may include an organic light emitting display (OLED) device, an inorganic light emitting display (inorganic EL) device, a quantum dot light emitting display (QED) device, a micro-LED display device, a nano-LED display device, a plasma display device (PDP), a field emission display (FED) device, a cathode ray tube (CRT) display device, a liquid crystal display (LCD) device, an electrophoretic display (EPD) device, and the like. Herein, the micro-LED display device will be described as an example of the display device 10, and the micro-LED display device applied to an embodiment will be simply referred to as a display device unless special distinction is required. However, embodiments are not limited to the micro-LED display device, and other display devices mentioned above or known in the art may be applied within the same scope of technical spirit.

In addition, in the drawings, a first direction DR1 indicates a horizontal direction of the display device 10, a second direction DR2 indicates a vertical direction of the display device 10, and a third direction DR3 indicates a thickness direction of the display device 10. In this case, "left," "right," "upper," and "lower" indicate directions when the display device 10 is viewed from above. For example, "right side" indicates one side of the first direction DR1, "left side" indicates the other side of the first direction DR1, "upper side" indicates one side of the second direction DR2, and "lower side" indicates the other side of the second direction DR2. Further, "above" indicates one side in the third direction DR3, and "below" indicates the other side in the third direction DR3.

The display device 10 according to an embodiment may have a circular shape, an elliptical shape, or a square shape in a plan view, for example, a regular tetragonal shape. In addition, when the display device 10 is a television, it may have a rectangular shape with a long side positioned in the horizontal direction. However, the present disclosure is not limited thereto, and the long side of the display device 10 may extend in a vertical direction. In another embodiment, the display device 1 may be installed to be rotatable such that its long side is variably positioned to extend in the horizontal or vertical direction.

The display device 10 may include a display area DPA and a non-display area NDA. The display area DPA may be an active area in which an image is displayed. The display area DPA may have a square shape in a plan view similar to an overall shape of the display device 10, but is not limited thereto and may have a circular shape or an elliptical shape.

The display area DPA may include a plurality of pixels PX. The plurality of pixels PX may be arranged in a matrix. The shape of each pixel PX may be rectangular or square in a plan view. However, without being limited thereto, each pixel PX may have a rhombic shape of which each side is inclined with respect to a side direction of the display device 10. In an embodiment, the pixels PX may include multiple color pixels PX. For example, the pixels PX may include, a first color pixel PX of red, a second color pixel PX of green, and a third color pixel PX of blue. However, the present disclosure is not limited thereto, and the plurality of pixels PX may further include a fourth color pixel PX of white. The color pixels PX may be alternately arranged in a stripe type or a Pentile™ type.

The non-display area NDA may be disposed around the display area DPA. The non-display area NDA may completely or partially surround the display area DPA. The display area DPA may have any of various shapes, such as a circle shape or a square shape. The non-display area NDA may be formed to surround a periphery of the display area DPA according to the shape of the display area DPA. The non-display area NDA may be a bezel portion of the display device 10.

In the non-display area NDA, a driving circuit or a driving element for driving the display area DPA may be disposed. In an embodiment, in the non-display area NDA disposed adjacent to a first side (e.g., a lower side in FIG. 1) of the display device 10, a pad portion may be provided on a display substrate of the display device 10, and an external device EXD may be mounted on pad electrodes of the pad portion. Examples of the external device EXD may include a connection film, a printed circuit board, a driver integrated circuit DIC, a connector, a wire connection film, and the like. A scan driver SDR directly formed on the display substrate of the display device 10 may be provided in the non-display area NDA disposed adjacent to a second side (e.g., a left side in FIG. 1) of the display device 10.

Figure 2:
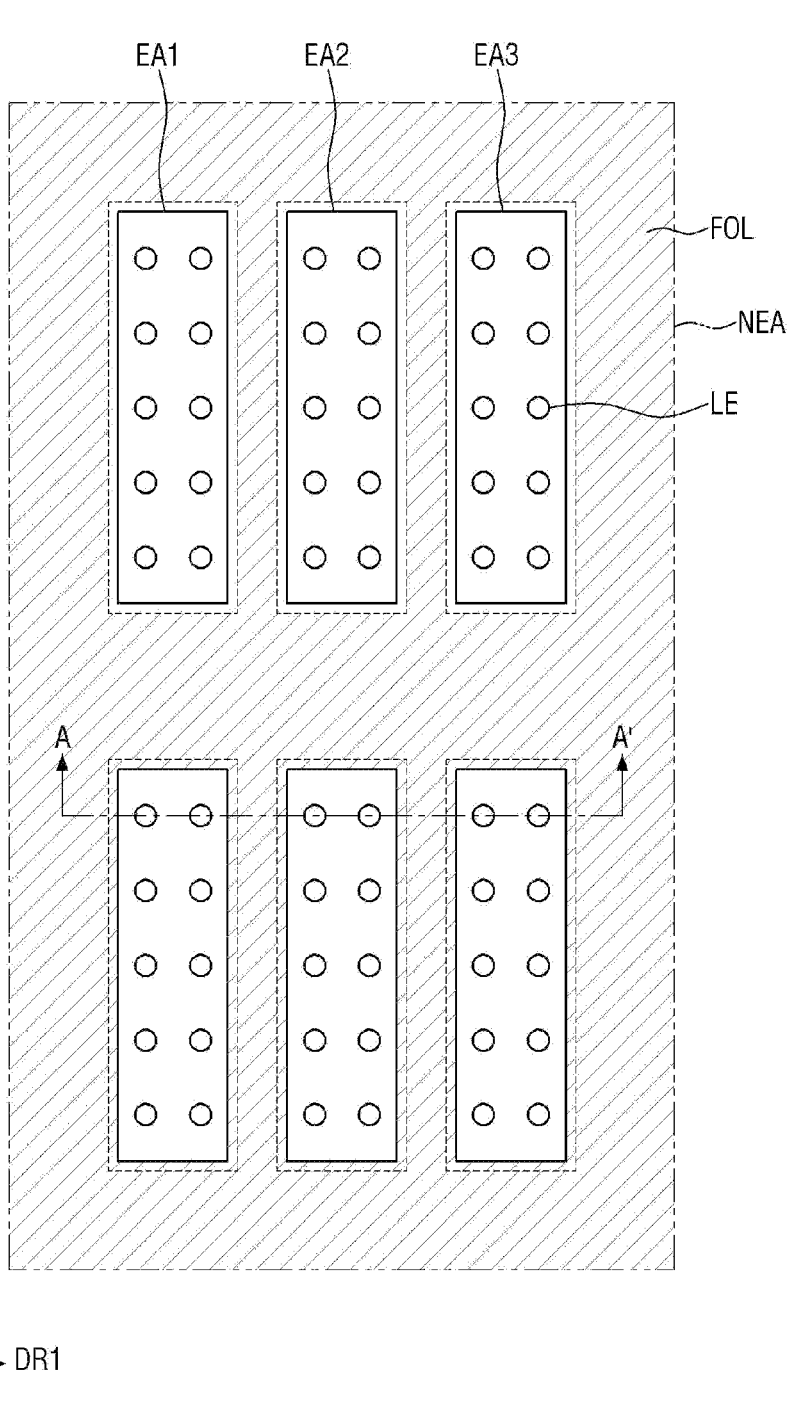
FIG. 2 is a plan view schematically illustrating an emission area of each pixel according to an embodiment of the present disclosure.

FIG. 2 is a plan view schematically illustrating an emission area of each pixel according to an embodiment.

Referring to FIG. 2, the plurality of pixels PX may be arranged in a stripe type in a matrix direction, and the plurality of pixels PX may be divided into a first color pixel PX of red, a second color pixel PX of green, and a third color pixel PX of blue. Further, the plurality of pixels PX may be divided to further include a fourth color pixel PX of white.

A pixel electrode of the first color pixel PX may be positioned in a first emission area EA1 of the first color pixel PX, but at least a part thereof may extend to a non-emission area NEA. A pixel electrode of the second color pixel PX may be positioned in a second emission area EA2 of the second color pixel PX, but at least a part thereof may extend to the non-emission area NEA. A pixel electrode of the third color pixel PX may be positioned in a third emission area EA3 of the third color pixel PX, but at least a part thereof may extend to the non-emission area NEA. A pixel electrode of each pixel PX may penetrate at least one layer of insulating layers to be connected to any switching element included in each pixel circuit.

A plurality of light emitting elements LE are disposed on the pixel electrode of the first emission area EA1, the pixel electrode of the second emission area EA2, and the pixel electrode of the third emission area EA3. That is, the light emitting element LE is disposed in each of the first emission area EA1, the second emission area EA2, and the third emission area EA3. In addition, a first color filter of a red color, a second color filter of a green color, and a third color filter of a blue color may be disposed on the first emission area EA1, the second emission area EA2, and the third emission area EA3 in which the plurality of light emitting elements LE are disposed, respectively. A first organic layer FOL may be disposed in the non-emission area NEA.

Figure 3:
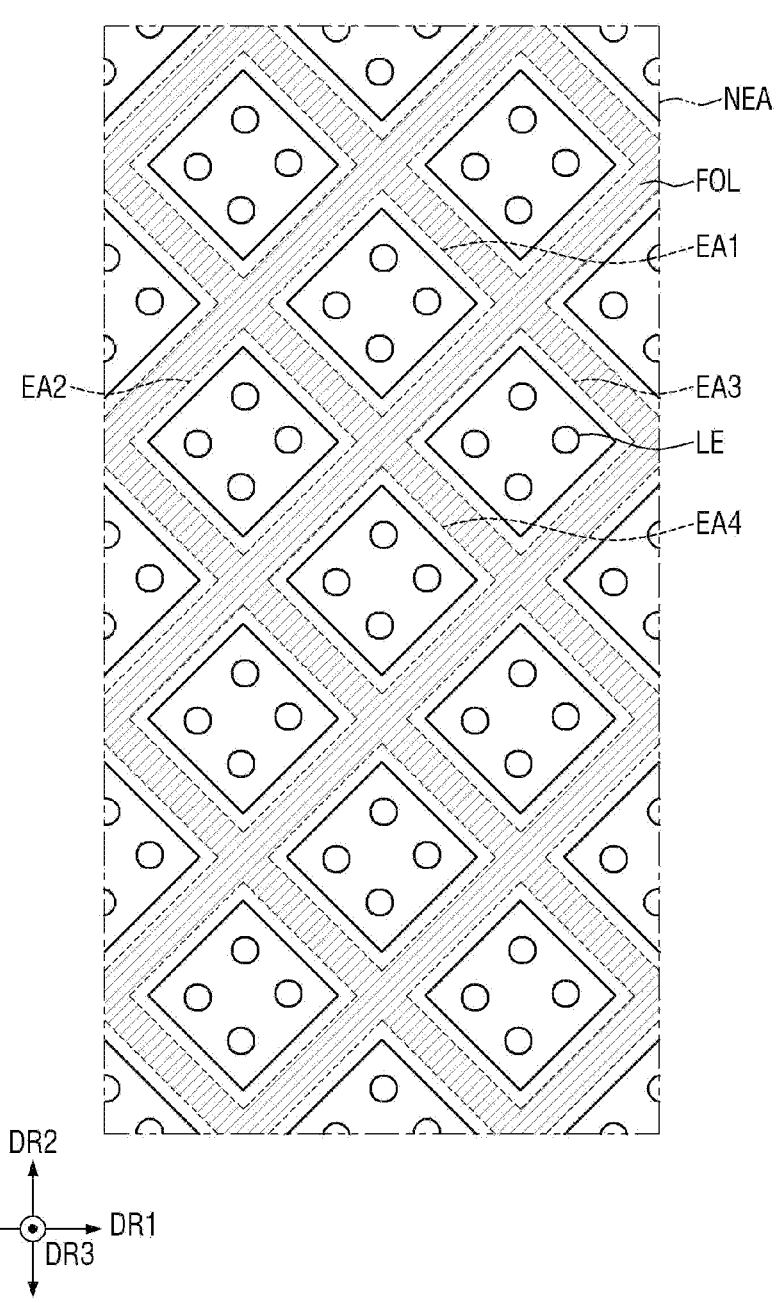
FIG. 3 is a plan view schematically illustrating an emission area of each pixel according to another embodiment of the present disclosure.

FIG. 3 is a plan view schematically illustrating an emission area of each pixel according to another embodiment.

Referring to FIG. 3, the shape of each pixel PX is not limited to a rectangular shape or a square shape in a plan view, and each side of the pixel PX may have a rhombus shape inclined with respect to a side direction of the display device 10 to form a Pentile™ matrix structure. Accordingly, in each of the pixels PX of the Pentile™ matrix structure, the first emission area EA1 of the first color pixel PX, the second emission area EA2 of the second color pixel PX, the third emission area EA3 of the third color pixel PX, and a fourth emission area EA4 of a color pixel PX having the same color as any one of the first to third colors may each be formed in a rhombus shape.

The first to fourth emission areas EA1 to EA4 of each pixel PX may be the same or different in size or planar area. Likewise, the number of light emitting elements LE disposed in each of the first to fourth emission areas EA1 to EA4 may be the same or different.

In an embodiment, an area of the first emission area EA1, an area of the second emission area EA2, an area of the third emission area EA3, and an area of the fourth emission area EA4 may be substantially the same, but are not limited thereto and may be different from each other. The distance between the first emission area EA1 and the second emission area EA2 adjacent to each other, the distance between the second emission area EA2 and the third emission area EA3 adjacent to each other, the distance between the first emission area EA1 and the third emission area EA3 adjacent to each other, and the distance between the third emission area EA3 and the fourth emission area EA4 adjacent to each other may be substantially the same, but may be different from each other. Embodiments of the present specification are not limited thereto.

In addition, the first emission area EA1 may emit the first color light, the second emission area EA2 may emit the second color light, and the third emission area EA3 and the fourth emission area EA4 may emit the third color light, but the embodiments of the present specification are not limited thereto. For example, the first emission area EA1 may emit the second color light, the second emission area EA2 may emit the first color light, and the third and fourth emission areas EA3 and EA4 may emit the third color light. In another embodiment, the first emission area EA1 may emit the third color light, the second emission area EA2 may emit the second color light, and the third and fourth emission areas EA3 and EA4 may emit the first color light. In another embodiment, at least one emission area of the first to fourth emission areas EA1 to EA4 may emit the fourth color light. The fourth color light may be light of a white or yellow wavelength band. For example, the main peak wavelength of the fourth color light may be positioned at approximately 550 nm to 600 nm, but embodiments of the present specification are not limited thereto.

Figure 4:
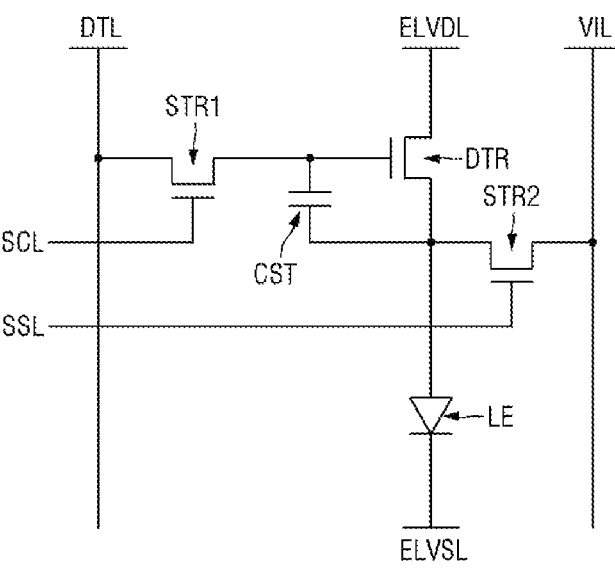
FIG. 4 is an equivalent circuit diagram of each pixel for each of pixels according to an embodiment of the present disclosure.

FIG. 4 is an equivalent circuit diagram of each of pixels according to an embodiment.

Referring to FIG. 4, each pixel PX may include three transistors DTR, STR1 and STR2 for light emission of the light emitting elements LE and one capacitor CST for storage. A driving transistor DTR adjusts a current flowing from a first power supply line ELVDL to which the first power voltage is supplied to any one light emitting element LE according to a voltage difference between a gate electrode and a source electrode. The gate electrode of the driving transistor DTR may be connected to the first electrode of a first transistor STR1, the source electrode thereof may be connected to the first electrode of any one light emitting element LE, and the drain electrode thereof may be connected to the first power supply line ELVDL to which the first power voltage is applied.

The first transistor STR1 is turned on by the scan signal of a scan line SCL to connect a data line DTL to the gate electrode of the driving transistor DTR. The gate electrode of the first transistor STR1 may be connected to the scan line SCL, the first electrode thereof may be connected to the gate electrode of the driving transistor DTR, and the second electrode thereof may be connected to the data line DTL.

A second transistor STR2 is turned on by the sensing signal of a sensing signal line SSL to connect an initialization voltage line VIL to the source electrode of the driving transistor DTR. The gate electrode of the second transistor STR2 may be connected to the sensing signal line SSL, the first electrode thereof may be connected to the initialization voltage line VIL, and the second electrode thereof may be connected to the source electrode of the driving transistor DTR.

In an embodiment, the first electrode of each of the first and second transistors STR1 and STR2 may be a source electrode and the second electrode thereof may be a drain electrode, but the present disclosure is not limited thereto, and may be vice versa.

The capacitor CST is formed between the gate electrode and the source electrode of the driving transistor DTR. The storage capacitor CST stores a difference voltage between a gate voltage and a source voltage of the driving transistor DTR.

In an embodiment, the driving transistor DTR, the first transistor STR1, and the second transistor STR2 may be formed as thin film transistors. Further, in the description of FIG. 4, it is assumed that the driving transistor DTR, the first switching transistor STR1, and the second switching transistor STR2 are N-type metal oxide semiconductor field effect transistors (MOSFETs), but the present disclosure is not limited thereto. That is, the driving transistor DTR, the first switching transistor STR1, and the second switching transistor STR2 may be P-type MOSFETs, or some of the driving transistor DTR, the first switching transistor STR1, and the second switching transistor STR2 may be N-type MOSFETs, while others may be P-type MOSFETs.

Figure 5:
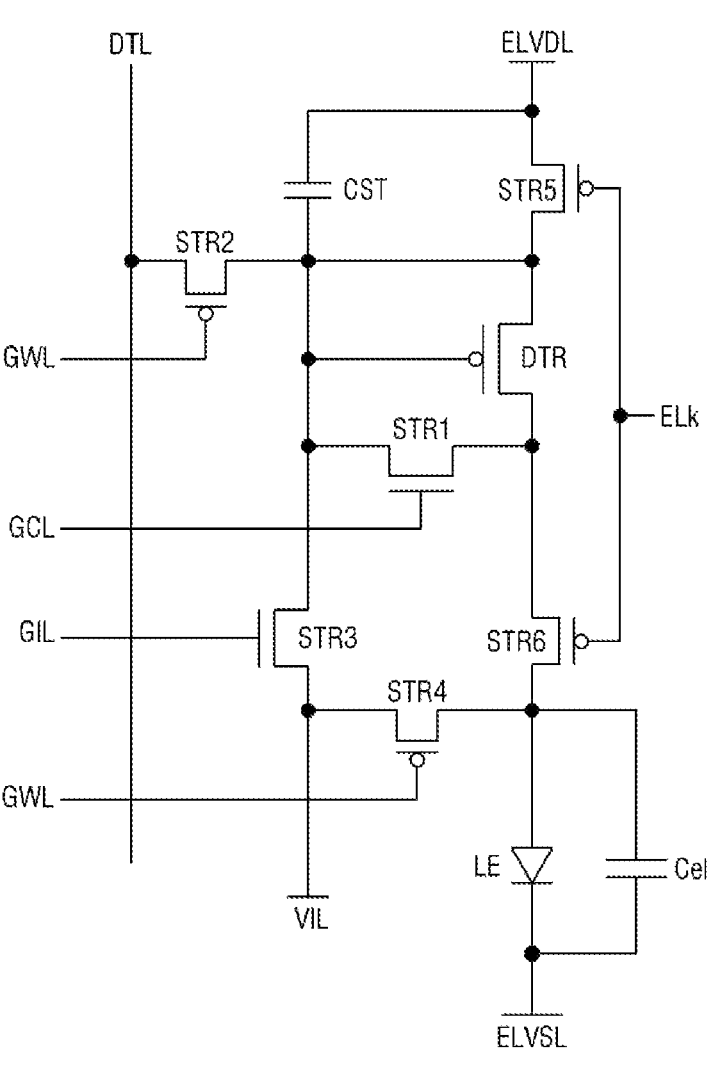
FIG. 5 is an equivalent circuit diagram of each of pixels according to another embodiment of the present disclosure.

FIG. 5 is an equivalent circuit diagram of each of pixels according to another embodiment.

Referring to FIG. 5, each pixel PX may include a capacitor CST, and a driving transistor DTR and a plurality of switch elements for light emission of the light emitting elements LE. In this case, the plurality of switch elements may include first to sixth transistors STR1, STR2, STR3, STR4, STR5, and STR6.

The driving transistor DTR includes a gate electrode, a first electrode, and a second electrode. The driving transistor DTR controls a drain-source current (Ids) (herein, referred to as "driving current") flowing between the first electrode and the second electrode according to a data voltage applied to the gate electrode.

The capacitor CST is formed between the second electrode of the driving transistor DTR and a second power line ELVSL. One electrode of the capacitor CST may be connected to the second electrode of the driving transistor DTR, and the other electrode thereof may be connected to the second power line ELVSL.

When the first electrode of each of the driving transistor DTR and the first to sixth transistors STR1 to STR6 is a source electrode, the second electrode thereof may be a drain electrode. In another embodiment, when the first electrode of each of the driving transistor DTR and the first to sixth transistors STR1 to STR6 is a drain electrode, the second electrode thereof may be a source electrode.

In an embodiment, the driving transistor DTR, the second transistor STR2, the fourth transistor STR4, the fifth transistor STR5, and the sixth transistor STR6 may be configured as P-type metal oxide semiconductor field effect transistors (MOSFETs), and the first transistor STR1 and the third transistor STR3 may be configured as N-type MOSFETs. In another embodiment, the first to sixth transistors STR1 to STR6, and the driving transistor DTR may be formed of a P-type metal oxide semiconductor field effect transistor (MOSFET).

However, the equivalent circuit diagram of the pixel according to the above-described embodiment of the present specification is not limited to those illustrated in FIGS. 4 and 5. The equivalent circuit diagram of the pixel according to an embodiment of the present specification may be formed in other known circuit structures that those skilled in the art may employ in addition to the embodiments illustrated in FIGS. 4 and 5.

Figure 6:
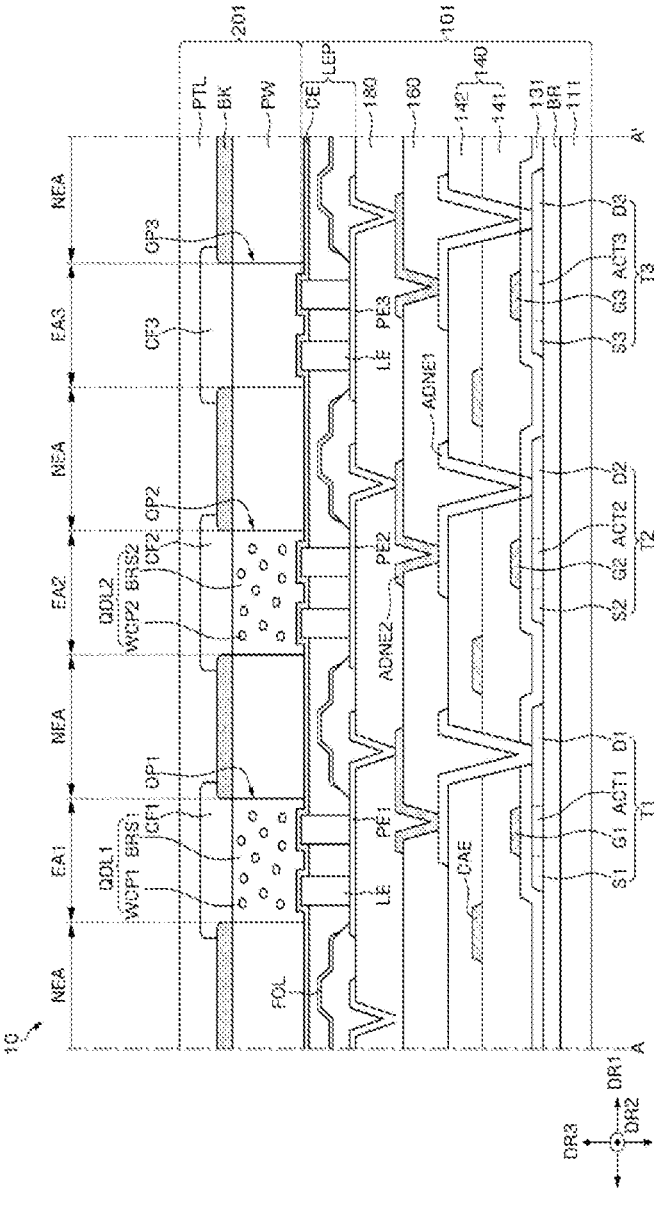
FIG. 6 is a cross-sectional view schematically illustrating a cross section A-A' of FIG. 2 according to an embodiment of the present disclosure.

FIG. 6 is a cross-sectional view schematically illustrating a cross section A-A' of FIG. 2 according to an embodiment. Further, FIG. 7 is an enlarged view schematically illustrating a first emission area of FIG. 6; and FIG. 8 is a cross-sectional view specifically illustrating a light emitting element of FIG. 7.

Figure 7:
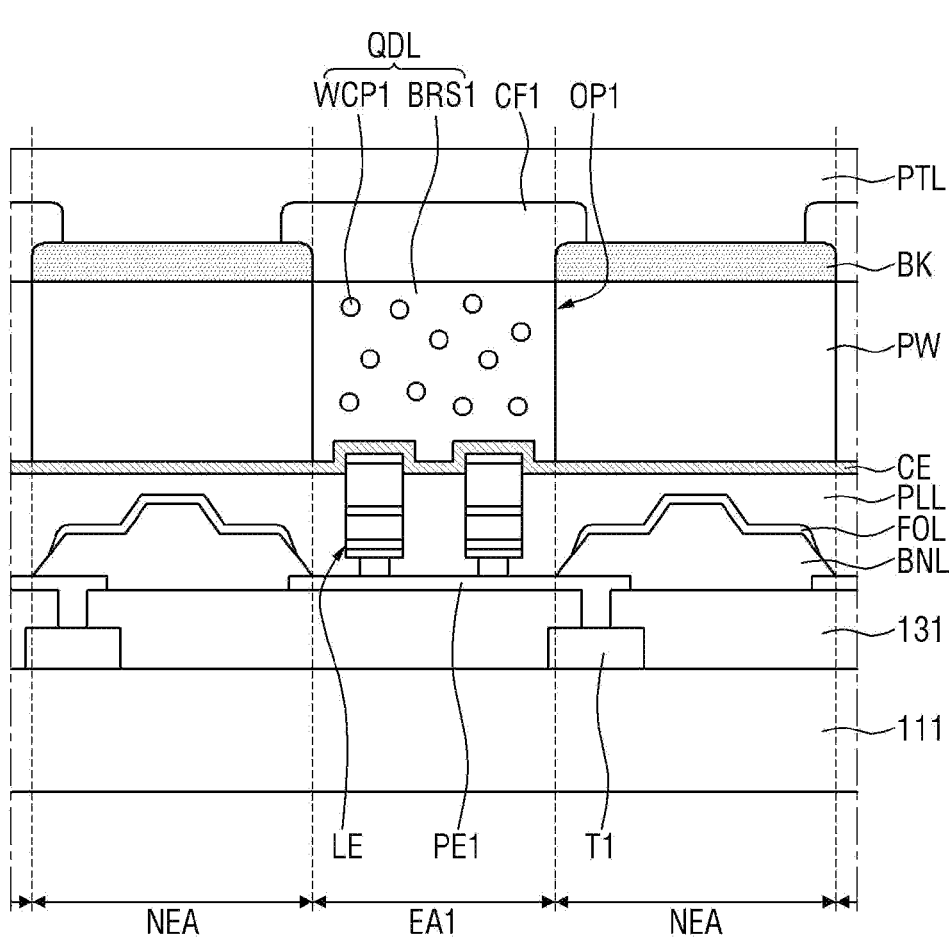
FIG. 7 is an enlarged view schematically illustrating a first emission area of FIG. 6.
Figure 7:
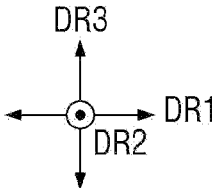
Figure 8:
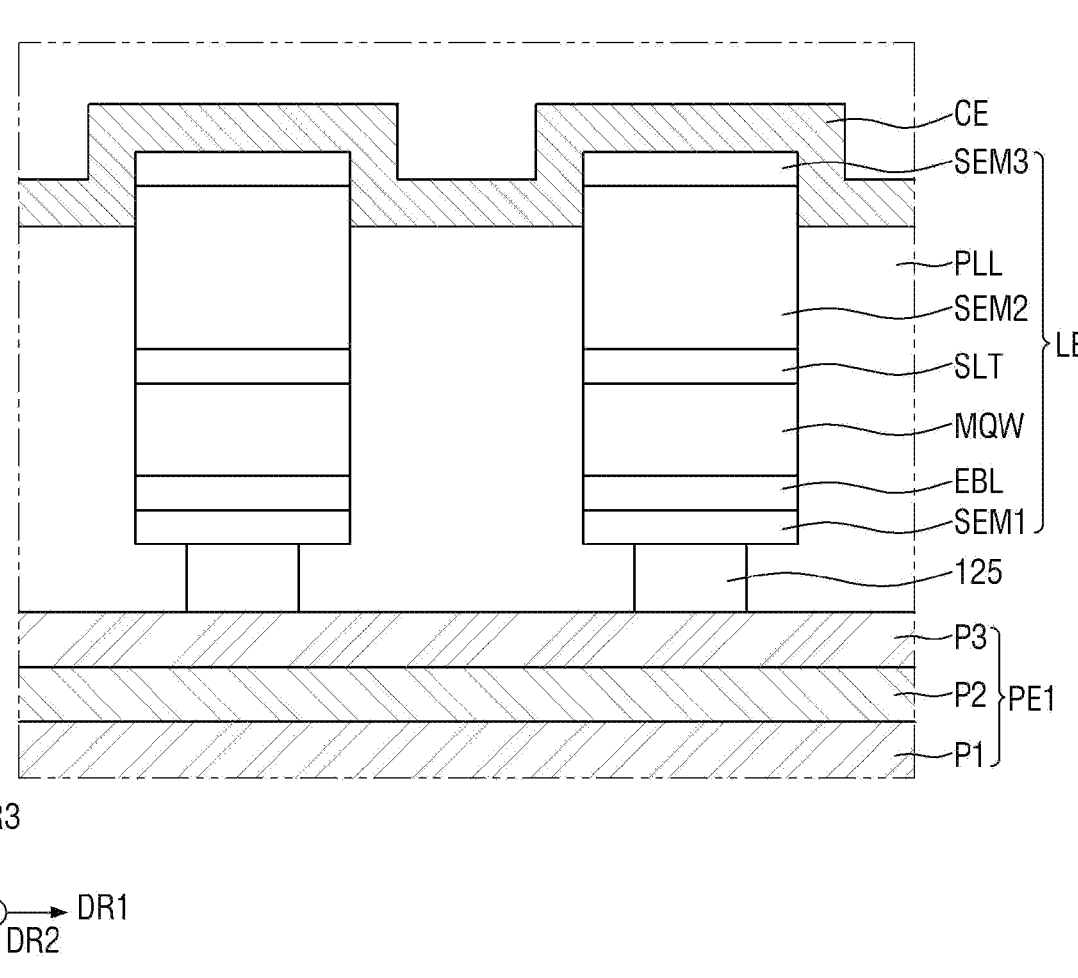
FIG. 8 is a cross-sectional view illustrating a light emitting element of FIG. 7.

Referring to FIGS. 6 to 8, a display panel of the display device 10 may include a display substrate 101 and a wavelength conversion member 201 disposed on the display substrate 101.

A barrier layer BR may be disposed on a first substrate 111 of the display substrate 101. The first substrate 111 may be formed of an insulating material, such as a polymer resin. For example, the first substrate 111 may be formed of polyimide. The first substrate 111 may be a flexible substrate which can be bent, folded, or rolled.

The barrier layer BR is a layer for protecting thin film transistors T1, T2, and T3 and a light emitting element unit LEP from moisture permeating through the first substrate 111 that is susceptible to moisture permeation. In an embodiment, the barrier layer BR may be formed as a plurality of inorganic layers that are alternately stacked. For example, the barrier layer BR may be formed of multiple layers in which one or more inorganic layers of a silicon nitride layer, a silicon oxynitride layer, a silicon oxide layer, a titanium oxide layer, and an aluminum oxide layer are alternately stacked.

Each of the thin film transistors T1, T2, and T3 may be disposed on the barrier layer BR. Each of the thin film transistors T1, T2, and T3 includes an active layer ACT1, a gate electrode G1, a source electrode S1, and a drain electrode D1.

The active layer ACT1, the source electrode S1, and the drain electrode D1 of the thin film transistors T1, T2, and T3 may be disposed on the barrier layer BR. In an embodiment, the active layer ACT1 of the thin film transistors T1, T2, and T3 includes polycrystalline silicon, monocrystalline silicon, low-temperature polycrystalline silicon, amorphous silicon, or an oxide semiconductor. The active layer ACT1 overlapping the gate electrode G1 in the third direction (Z-axis direction) that is the thickness direction of the first substrate 111 may be defined as a channel region. The source electrode S1 and the drain electrode D1 that do not overlap the gate electrode G1 in the third direction (Z-axis direction) may have conductivity by doping a silicon semiconductor or an oxide semiconductor with ions or impurities.

A gate insulating layer 131 may be disposed on the active layer ACT1, the source electrode S1, and the drain electrode D1 of the thin film transistors T1, T2, and T3. The gate insulating layer 131 may be formed of an inorganic layer, for example, a silicon nitride layer, a silicon oxynitride layer, a silicon oxide layer, a titanium oxide layer, or an aluminum oxide layer.

The gate electrode G1 of the thin film transistors T1, T2, and T3 may be arranged on the gate insulating layer 131. The gate electrode G1 may overlap the active layer ACT1 in the third direction (Z-axis direction). The gate electrode G1 may be formed as a single layer or multiple layers made of any of molybdenum (Mo), aluminum (Al), chromium (Cr), gold (Au), titanium (Ti), nickel (Ni), neodymium (Nd), and copper (Cu), or an alloy thereof.

A first interlayer insulating layer 141 may be disposed on the gate electrode G1 of the thin film transistors T1, T2, and T3. The first interlayer insulating layer 141 may be formed of an inorganic layer, for example, a silicon nitride layer, a silicon oxynitride layer, a silicon oxide layer, a titanium oxide layer, or an aluminum oxide layer. In an embodiment, the first interlayer insulating layer 141 may be formed of a plurality of inorganic layers.

A capacitor electrode CAE may be disposed on the first interlayer insulating layer 141. The capacitor electrode CAE may overlap the gate electrode G1 of the thin film transistors T1, T2, and T3 in the third direction (Z-axis direction). Since the first interlayer insulating layer 141 has a certain dielectric constant (e.g., a predetermined dielectric constant), the capacitor electrode CAE, the gate electrode G1, and the first interlayer insulating layer 141 disposed therebetween may form a capacitor. The capacitor electrode CAE may be formed as a single layer or multiple layers made of any of molybdenum (Mo), aluminum (Al), chromium (Cr), gold (Au), titanium (Ti), nickel (Ni), neodymium (Nd), and copper (Cu), or an alloy thereof.

A second interlayer insulating layer 142 may be disposed on the capacitor electrode CAE. The second interlayer insulating layer 142 may be formed of an inorganic layer, for example, a silicon nitride layer, a silicon oxynitride layer, a silicon oxide layer, a titanium oxide layer, or an aluminum oxide layer. In an embodiment, the second interlayer insulating layer 142 may be formed of a plurality of inorganic layers.

A first anode connection electrode ADNE1 may be disposed on the second interlayer insulating layer 142. The first anode connection electrode ADNE1 may be connected to the drain electrode D1 of the thin film transistor STR1 through a first connection contact hole penetrating the gate insulating layer 131, the first interlayer insulating layer 141, and the second interlayer insulating layer 142. The first anode connection electrode ADNE1 may be formed as a single layer or multiple layers made of any of molybdenum (Mo), aluminum (Al), chromium (Cr), gold (Au), titanium (Ti), nickel (Ni), neodymium (Nd), and copper (Cu), or an alloy thereof.

A first planarization layer 160 for flattening a stepped portion formed by the thin film transistors T1, T2, and T3 may be disposed on the first anode connection electrode ADNE1. The first planarization layer 160 may be formed of an organic layer, such as any of acryl resin, epoxy resin, phenolic resin, polyamide resin, polyimide resin, and the like.

A second anode connection electrode ADNE2 may be disposed on the first planarization layer 160. The second anode connection electrode ADNE2 may be connected to the first anode connection electrode ADNE1 through a second connection contact hole penetrating the first planarization layer 160. The second anode connection electrode ADNE2 may be formed as a single layer or multiple layers made of any of molybdenum (Mo), aluminum (Al), chromium (Cr), gold (Au), titanium (Ti), nickel (Ni), neodymium (Nd), and copper (Cu), or an alloy thereof.

A second planarization layer 180 may be disposed on the second anode connection electrode ADNE2. The second planarization layer 180 may be formed of an organic layer, such as any of acryl resin, epoxy resin, phenolic resin, polyamide resin, polyimide resin, and the like.

The light emitting element unit LEP may be formed on the second planarization layer 180. The light emitting element unit LEP may include a plurality of pixel electrodes PE1, PE2, and PE3, the plurality of light emitting elements LE, and a common electrode CE.

The plurality of pixel electrodes PE1, PE2, and PE3 may include the first pixel electrode PE1, the second pixel electrode PE2, and the third pixel electrode PE3. The first pixel electrode PE1, the second pixel electrode PE2, and the third pixel electrode PE3 may serve as a first electrode of the light emitting element LE and may be an anode electrode or a cathode electrode. The first pixel electrode PE1 may be positioned in the first emission area EA1, but at least a part thereof may extend to the non-emission area NEA. The second pixel electrode PE2 may be positioned in the second emission area EA2, but at least a part thereof may extend to the non-emission area NEA. The third pixel electrode PE3 may be positioned in the third emission area EA3, but at least a part thereof may extend to the non-emission area NEA. The first pixel electrode PE1 may penetrate an insulating layer 131 to be connected to a first switching element T1, the second pixel electrode PE2 may penetrate the insulating layer 131 to be connected to a second switching element T2, and the third pixel electrode PE3 may penetrate the insulating layer 131 to be connected to a third switching element T3.

In an embodiment, the first pixel electrode PE1, the second pixel electrode PE2, and the third pixel electrode PE3 may be reflective electrodes. The first pixel electrode PE1, the second pixel electrode PE2, and the third pixel electrode PE3 may be formed of titanium (Ti), copper (Cu), or an alloy material of titanium (Ti) and copper (Cu). In addition, the pixel electrodes may have a stacked structure of titanium (Ti) and copper (Cu). In addition, the first pixel electrode PE1, the second pixel electrode PE2, and the third pixel electrode PE3 may have a stacked structure formed by stacking a material layer having a high work function, such as titanium oxide ($TiO_2$), indium tin oxide (ITO), indium zinc oxide (IZO), zinc oxide (ZnO), indium tin zinc oxide (ITZO), or magnesium oxide (MgO), and a reflective material layer such as silver (Ag), magnesium (Mg), aluminum (Al), platinum (Pt), lead (Pb), gold (Au), nickel (Ni), neodymium (Nd), iridium (Ir), chromium (Cr), lithium (Li), calcium (Ca), titanium (Ti), copper (Cu), or a mixture thereof. The material layer having a high work function may be disposed above the reflective material layer and disposed closer to the light emitting element LE. In an embodiment, the first pixel electrode PE1, the second pixel electrode PE2, and the third pixel electrode PE3 may have a multilayer structure of ITO/Mg, ITO/MgF, ITO/Ag, and ITO/Ag/ITO, but are not limited thereto.

A bank BNL may be positioned on the first pixel electrode PE1, the second pixel electrode PE2, and the third pixel electrode PE3. The bank BNL may include an opening exposing the first pixel electrode PE1, an opening exposing the second pixel electrode PE2, and an opening exposing the third pixel electrode PE3, and may define the first emission area EA1, the second emission area EA2, the third emission area EA3, and the non-emission area NEA. That is, an area of the first pixel electrode PE1 that is not covered by the bank BNL and is exposed may be the first emission area EA1. An area of the second pixel electrode PE2 that is not covered by the bank BNL and is exposed may be the second emission area EA2. An area of the third pixel electrode PE3 that is not covered by the bank BNL and is exposed may be the third emission area EA3. In addition, an area in which the bank BNL is positioned may be the non-emission area NEA.

In an embodiment, the bank BNL may include an inorganic insulating material, for example, acrylic resin, epoxy resin, phenolic resin, polyamide resin, polyimide resin, unsaturated polyester resin, polyphenylene resin, polyphenylenesulfide resin, benzocyclobutene (BCB), or the like.

In an embodiment, the bank BNL may overlap the color filters CF1, CF2, and CF3 and a light blocking member BK of the wavelength conversion member 201, which will be described later. In an embodiment, the bank BNL may completely overlap the light blocking member BK. In addition, the bank BNL may overlap the first color filter CF1, the second color filter CF2, and the third color filter CF3.

The plurality of light emitting elements LE may be disposed on the first pixel electrode PE1, the second pixel electrode PE2, and the third pixel electrode PE3.

As illustrated in FIGS. 7 and 8, the light emitting element LE may be disposed in each of the first emission area EA1, the second emission area EA2, and the third emission area EA3. In an embodiment, the light emitting element LE may be a vertical light emitting diode element elongated in the third direction DR3. That is, a length of the light emitting element LE in the third direction DR3 may be longer than a length thereof in the horizontal direction. The length in the horizontal direction indicates a length in the first direction DR1 or a length in the second direction DR2. For example, the length of the light emitting element LE in the third direction DR3 may be approximately 1 to 5 μm.

In an embodiment, the light emitting element LE may be a micro light emitting diode element. The light emitting element LE may include a connection electrode 125, a first semiconductor layer SEM1, an electron blocking layer EBL, an active layer MQW, a superlattice layer SLT, a second semiconductor layer SEM2, and a third semiconductor layer SEM3, in the thickness direction of the display substrate 101, that is, the third direction DR3. The connection electrode 125, the first semiconductor layer SEM1, the electron blocking layer EBL, the active layer MQW, the superlattice layer SLT, the second semiconductor layer SEM2, and the third semiconductor layer SEM3 may be sequentially stacked in the third direction DR3.

The light emitting element LE may have a cylindrical shape that is longer in width than in height, e.g., a disc shape or a rod shape. However, the present disclosure is not limited thereto, and the light emitting element LE may have any of various shapes, such as a rod shape, a wire shape, a tube shape, a polygonal prism shape, such as any of a regular cube, a rectangular parallelepiped, and a hexagonal prism, or a shape extending in a direction and having a partially inclined outer surface.

The connection electrode 125 may be disposed on each of the plurality of pixel electrodes PE1, PE2, and PE3. Herein, the light emitting element LE disposed on the first pixel electrode PE1 will be described as an example.

The connection electrode 125 may serve to apply an emission signal to the light emitting element LE by being adhered to the first pixel electrode PE1. In an embodiment, the connection electrode 125 may be an ohmic connection electrode. However, the present disclosure is not limited thereto, and the connection electrode 125 may be a Schottky connection electrode. The light emitting element LE may include at least one connection electrode 125. FIGS. 7 and 8 illustrate that the light emitting element LE includes one connection electrode 125, but embodiments of the present disclosure are not limited thereto. In some cases, the light emitting element LE may include a larger number of connection electrodes 125 or may omit the connection electrode 125. The following description of the light emitting element LE may be equally applied even if the number of connection electrodes 125 is different or other structures are further included.

When the light emitting element LE is electrically connected to the first pixel electrode PE1 in the display device 10 according to an embodiment, the connection electrode 125 may reduce resistance and improve adhesion between the light emitting element LE and the first pixel electrode PE1. In an embodiment, the connection electrode 125 may include a conductive metal oxide. For example, the connection electrode 125 may be ITO. In an embodiment, since the connection electrode 125 is directly in contact with and connected to the lower first pixel electrode PE1, the connection electrode 125 may be made of a same material as the first pixel electrode PE1. In addition, the connection electrode 125 may selectively further include a reflective electrode made of a metal material having a high reflectivity, such as aluminum (Al) or a diffusion barrier layer including nickel (Ni). Accordingly, adhesion between the connection electrode 125 and the first pixel electrode PE1 may be improved, and, thus, a contact characteristic may be increased.

Referring to FIG. 8, in an embodiment, the first pixel electrode PE1 may include a lower electrode layer P1, a reflective layer P2, and an upper electrode layer P3. The lower electrode layer P1 may be disposed at a lowermost portion of the first pixel electrode PE1 and may be electrically connected from the switching element. The lower electrode layer P1 may include a metal oxide, and may include, for example, titanium oxide ($TiO_2$), indium tin oxide (ITO), indium zinc oxide (IZO), zinc oxide (ZnO), indium tin zinc oxide (ITZO), magnesium oxide (MgO), or the like.

The reflective layer P2 may be disposed on the lower electrode layer P1 to reflect light emitted from the light emitting element LE upward. The reflective layer P2 may include a metal having high reflectivity, and may include, for example, silver (Ag), magnesium (Mg), aluminum (Al), platinum (Pt), lead (Pd), gold (Au), nickel. (Ni), neodymium (Nd), iridium (Ir), chromium (Cr), lithium (Li), calcium (Ca), or a mixture thereof.

The upper electrode layer P3 may be disposed on the reflective layer P2 and may be directly in contact with the light emitting element LE. The upper electrode layer P3 may be disposed between the reflective layer P2 and the connection electrode 125 of the light emitting element LE, and may be directly in contact with the connection electrode 125. As described above, the connection electrode 125 is made of a metal oxide, and the upper electrode layer P3 may also be made of a metal oxide in a same manner as the connection electrode 125.

The upper electrode layer P3 may be formed of titanium (Ti), copper (Cu), or an alloy material of titanium (Ti) and copper (Cu). In addition, the upper electrode layer P3 may have a stacked structure of titanium (Ti) and copper (Cu). In addition, the upper electrode layer P3 may include titanium oxide ($TiO_2$), indium tin oxide (ITO), indium zinc oxide (IZO), zinc oxide (ZnO), indium tin zinc oxide (ITZO), or magnesium oxide (MgO). In an embodiment, when the connection electrode 125 is made of ITO, the first pixel electrode PE1 may have a multilayer structure of ITO/Ag/ITO.

The first semiconductor layer SEM1 may be disposed on the connection electrode 125. In an embodiment, the first semiconductor layer SEM1 may be a p-type semiconductor, and may include a semiconductor material having a chemical formula of $AlxGayIn1-x-yN$ ($0 \leq x \leq 1$, $0 \leq y \leq 1$, $0 \leq x+y \leq 1$). For example, the semiconductor material may be any one or more of p-type doped AlGaInN, GaN, AlGaN, InGaN, AlN and InN. The first semiconductor layer SEM1 may be doped with a p-type dopant, and the p-type dopant may be Mg, Zn, Ca, Se, Ba, or the like. For example, the first semiconductor layer SEM1 may be p-GaN doped with p-type Mg. In an embodiment, a thickness of the first semiconductor layer SEM1 may be in a range of 30 nm to 200 nm, but is not limited thereto.

The electron blocking layer EBL may be disposed on the first semiconductor layer SEM1. The electron blocking layer EBL may be a layer for suppressing or preventing too many electrons from flowing into the active layer MQW. For example, the electron blocking layer EBL may be p-AlGaN doped with p-type Mg. In an embodiment, a thickness of the electron blocking layer EBL may be within a range of 10 nm to 50 nm, but the present disclosure is not limited thereto. In an embodiment, the electron blocking layer EBL may be omitted.

The active layer MQW may be disposed on the electron blocking layer EBL. The active layer MQW may emit light by coupling of electron-hole pairs according to an electrical signal applied through the first semiconductor layer SEM1 and the second semiconductor layer SEM2.

The active layer MQW may include a material having a single or multiple quantum well structure. In an embodiment, when the active layer MQW contains a material having a multiple quantum well structure, the active layer MQW may have the structure in which a plurality of well layers and barrier layers are alternately laminated. In an embodiment, the well layer may be formed of InGaN, and the barrier layer may be formed of GaN or AlGaN, but the present disclosure is not limited thereto. In an embodiment, a thickness of the well layer may be approximately 1 to 4 nm, and a thickness of the barrier layer may be 3 nm to 10 nm.

In another embodiment, the active layer MQW may have a structure in which semiconductor materials having large band gap energy and semiconductor materials having small band gap energy are alternately stacked, and may include other group III to V semiconductor materials according to the wavelength band of the emitted light. The light emitted by the active layer MQW is not limited to the first light, and in some cases, the second light (e.g., light of the green wavelength band) or the third light (e.g., light of the red wavelength band) may be emitted.

The color of the light emitted from the active layer MQW may vary according to a content of indium (In). For example, as the content of indium (In) increases or becomes higher, the wavelength band of light emitted by the active layer may shift to a red wavelength band, and as the content of indium (In) decreases or becomes lower, the wavelength band of light emitted by the active layer may shift to a blue wavelength band.

For example, when the content of indium (In) is 35% or more, the active layer MQW may emit the first light in the red wavelength band having a main peak wavelength in a range of approximately 600 nm to 750 nm. In another embodiment, when the content of indium (In) is 25%, the active layer MQW may emit the second light in the green wavelength band having a main peak wavelength in a range of approximately 480 nm to 560 nm. In another embodiment, when the content of indium (In) is 15% or less, the active layer MQW may emit the third light in the blue wavelength band having a main peak wavelength in a range of approximately 370 nm to 460 nm. An example in which the active layer MQW emits light in the blue wavelength band having a main peak wavelength of approximately 370 nm to 460 nm will be described with reference to FIG. 6.

The superlattice layer SLT may be disposed on the active layer MQW. The superlattice layer SLT may be a layer for relieving stress between the second semiconductor layer SEM2 and the active layer MQW. For example, the superlattice layer SLT may be formed of InGaN or GaN. In an embodiment, a thickness of the superlattice layer SLT may be about 50 nm to 200 nm. In an embodiment, the superlattice layer SLT may be omitted.

The second semiconductor layer SEM2 may be disposed on the superlattice layer SLT. The second semiconductor layer SEM2 may be an n-type semiconductor. The second semiconductor layer SEM2 may include a semiconductor material having a chemical formula of $AlxGayIn1-x-yN$ ($0 \leq x \leq 1$, $0 \leq y \leq 1$, $0 \leq x+y \leq 1$). For example, the semiconductor material may be any one or more of n-type doped AlGaInN, GaN, AlGaN, InGaN, AlN and InN. The second semiconductor layer SEM2 may be doped with an n-type dopant, and the n-type dopant may be Si, Ge, Sn, or the like. For example, the second semiconductor layer SEM2 may be n-GaN doped with n-type Si. In an embodiment, a thickness of the second semiconductor layer SEM2 may be within a range of 2 μm to 4 μm, but the present disclosure is not limited thereto.

The third semiconductor layer SEM3 may be disposed on the second semiconductor layer SEM2. The third semiconductor layer SEM3 may be disposed between the second semiconductor layer SEM2 and the common electrode CE. The third semiconductor layer SEM3 may be an undoped semiconductor. The third semiconductor layer SEM3 may contain a same material as that of the second semiconductor layer SEM2, and may contain a material that is not doped with an n-type or p-type dopant. In an embodiment, the third semiconductor layer SEM3 may be, but is not limited to, at least one of undoped InAlGaN, GaN, AlGaN, InGaN, AlN, or InN.

A planarization layer PLL may be disposed on the bank BNL and the plurality of pixel electrodes PE1, PE2, and PE3. The planarization layer PLL may planarize a lower step such that the common electrode CE, which will be described later, may be formed. The planarization layer PLL may be formed to have a certain height (e.g., a predetermined height) such that at least a part, for example, an upper portion, of the plurality of light emitting elements LE, may protrude above the planarization layer PLL. That is, the height of the planarization layer PLL with respect to the top surface of the first pixel electrode PE1 may be smaller than the height of the light emitting element LE.

The planarization layer PLL may include an organic material to planarize the lower step. For example, the planarization layer PLL may include acrylic resin, epoxy resin, phenolic resin, polyamide resin, polyimide resin, unsaturated polyester resin, polyphenylene resin, polyphenylenesulfide resin, benzocyclobutene (BCB), or the like.

The common electrode CE may be disposed on the planarization layer PLL and the plurality of light emitting elements LE. In an embodiment, the common electrode CE may be disposed on a surface of the first substrate 111 on which the light emitting element LE is formed, and may be disposed entirely in the display area DPA and the non-display area NDA. The common electrode CE is disposed to overlap each of the emission areas EA1, EA2, and EA3 in the display area DPA, and may have a thin thickness to allow light to be emitted.

In an embodiment, the common electrode CE may be directly disposed on a top surface and a side surface of the plurality of light emitting elements LE. The common electrode CE may be directly in contact with the second semiconductor layer SEM2 and the third semiconductor layer SEM3 among the side surfaces of the light emitting element LE. As illustrated in FIG. 6, the common electrode CE may be a common layer that covers the plurality of light emitting elements LE and is disposed by commonly connecting the plurality of light emitting elements LE. Since the second semiconductor layer SEM2 having conductivity has a patterned structure in each of the light emitting elements LE, the common electrode CE may be directly in contact with the side surface of the second semiconductor layer SEM2 of each of the light emitting elements LE such that a common voltage may be applied to each of the light emitting elements LE.

In an embodiment, since the common electrode CE is entirely disposed on the first substrate 111 and a common voltage is applied, the common electrode CE may include a material having a low resistance. In addition, the common electrode CE may be formed to have a thin thickness to allow light to pass therethrough. For example, the common electrode CE may include a material having a low resistance, such as aluminum (Al), silver (Ag), copper (Cu), or the like. In an embodiment, a thickness of the common electrode CE may be approximately 10 Å to 200 Å, but is not limited thereto.

The above-described light emitting elements LE may be supplied with a pixel voltage or an anode voltage from a pixel electrode through the connection electrode 125, and may be supplied with a common voltage through the common electrode CE. The light emitting element LE may emit light with a certain luminance (e.g., a predetermined luminance) according to a voltage difference between the pixel voltage and the common voltage.

In an embodiment, by disposing the plurality of light emitting elements LE, that is, inorganic light emitting diodes on the pixel electrodes PE1, PE2, and PE3, the disadvantages of organic light emitting diodes, which are vulnerable to external moisture or oxygen, may be excluded, and life span and reliability may be improved.

The first organic layer FOL may be disposed on the bank BNL disposed in the non-emission area NEA.

The first organic layer FOL may overlap the non-emission area NEA and may be disposed not to overlap the emission areas EA1, EA2, and EA3. The first organic layer FOL may be disposed directly on the bank BNL and may be disposed to be spaced apart from a plurality of adjacent pixel electrodes PE1, PE2, and PE3. The first organic layer FOL may be disposed on the entire first substrate 111, and may be disposed to surround the plurality of emission areas EA1, EA2, and EA3. The first organic layer FOL may be disposed in a lattice shape as a whole.

The first organic layer FOL may serve to detach the plurality of light emitting elements LE in contact with the first organic layer FOL, which is the non-emission area NEA, as will be described in a fabricating process to be described later. In an embodiment, when the laser light is irradiated, the first organic layer FOL absorbs energy and instantaneously increases its temperature to be ablated. Accordingly, the plurality of light emitting elements LE in contact with the top surface of the first organic layer FOL may be detached from the top surface of the first organic layer FOL.

The first organic layer FOL may contain a polyimide-based compound. In an embodiment, the polyimide-based compound of the first organic layer FOL may have a cyano group to absorb light having a wavelength of 308 nm, e.g., laser light. In an embodiment, each of the first organic layer FOL and the bank BNL may include a polyimide-based compound, but may include different polyimide-based compounds. For example, the bank BNL may be formed of a polyimide-based compound not including a cyano group, and the first organic layer FOL may be formed of a polyimide-based compound including a cyano group. In an embodiment, for laser light having a wavelength of 308 nm, the transmittance of the first organic layer FOL may be less than the transmittance of the bank BNL, the transmittance of the bank BNL is about 60% or more, and the transmittance of the first organic layer FOL may be 0%. In addition, the absorption rate of the first organic layer FOL with respect to laser light having a wavelength of 308 nm may be 100%. In an embodiment, the first organic layer FOL may have a thickness in a range of about 2 Å to 10 μm. When the thickness of the first organic layer FOL is 2 Å or more, the absorption rate of laser light having a wavelength of 308 nm may be improved. When the thickness of the first organic layer FOL is 10 μm or less, a height difference between the first organic layer FOL and the pixel electrode PE1 may be prevented or substantially prevented from increasing, such that the light emitting element LE may be easily adhered onto the pixel electrode in a process to be described later.

The wavelength conversion member 201 may be disposed on the light emitting element unit LEP. In an embodiment, the wavelength conversion member 201 may include a partition wall PW, a wavelength conversion layer QDL, the color filters CF1, CF2, and CF3, the light blocking member BK, and a passivation layer PTL.

The partition wall PW may be disposed on the common electrode CE of the display area DPA, and may partition the plurality of emission areas EA1, EA2, and EA3 together with the bank BNL. The partition wall PW may be disposed to extend in the first direction DR1 and the second direction DR2, and may be formed in a grid pattern in the entire display area DPA. Further, the partition wall PW may not overlap the plurality of emission areas EA1, EA2, and EA3, and may overlap the non-emission area NEA.

The partition wall PW may include a plurality of openings OP1, OP2, and OP3 exposing the lower common electrode CE. The plurality of openings OP1, OP2, and OP3 may include a first opening OP1 overlapping the first emission area EA1, a second opening OP2 overlapping the second emission area EA2, and a third opening OP3 overlapping the third emission area EA3. Here, the plurality of openings OP1, OP2, and OP3 may correspond to the plurality of emission areas EA1, EA2, and EA3. That is, the first opening OP1 may correspond to the first emission area EA1, the second opening OP2 may correspond to the second emission area EA2, and the third opening OP3 may correspond to the third emission area EA3.

The partition wall PW may serve to provide a space for first and second wavelength conversion layers QDL1 and QDL2 to be formed. To this end, the partition wall PW may have a certain thickness (e.g., a predetermined thickness). For example, the thickness of the partition wall PW may be in a range of 1 μm to 10 μm. The partition wall PW may contain an organic insulating material to have a certain thickness (e.g., a predetermined thickness). The organic insulating material may contain, for example, epoxy resin, acrylic resin, cardo resin or imide resin.

The first wavelength conversion layer QDL1 may be disposed in each of the first openings OP1. The first wavelength conversion layer QDL1 may be formed of an island pattern in a shape of dots spaced apart from each other. The first wavelength conversion layer QDL1 may include a first base resin BRS1 and a first wavelength conversion particle WCP1. The first base resin BRS1 may include a light-transmissive organic material. For example, the first base resin BRS1 may contain epoxy resin, acrylic resin, cardo resin, or imide resin. The first wavelength conversion particle WCP1 may be a quantum dot (QD), a quantum rod, a fluorescent material, or a phosphorescent material. For example, a quantum dot may be a particulate material that emits light of a specific color when an electron transitions from a conduction band to a valence band.

The quantum dot may be a semiconductor nanocrystal material. The quantum dot may have a specific band gap according to its composition and size. Thus, the quantum dot may absorb light and then emit light having an intrinsic wavelength. Examples of semiconductor nanocrystal of quantum dots may include group IV nanocrystal, group II-VI compound nanocrystal, group III-V compound nanocrystal, group IV-VI nanocrystal, a combination thereof, or the like.

The first wavelength conversion layer QDL1 may be formed in the first opening OP1 of the first emission area EA1. The first wavelength conversion layer QDL1 may emit light by converting or shifting a peak wavelength of incident light to another specific peak wavelength. The first wavelength conversion layer QDL1 may convert a part of the blue light emitted from the light emitting element LE into light similar to red light, which is the first light. The first wavelength conversion layer QDL1 may emit light similar to red light and thus may perform conversion into red light, which is the first light, through the first color filter CF1.

The second wavelength conversion layer QDL2 may be disposed in each of the second opening holes OP2. The second wavelength conversion layer QDL2 may be formed of an island pattern in a shape of dots spaced apart from each other. For example, the second wavelength conversion layer QDL2 may be disposed to overlap the second emission area EA2. The second wavelength conversion layer QDL2 may include a second base resin BRS2 and a second wavelength conversion particle WCP2. The second base resin BRS2 may contain a light-transmissive organic material. Accordingly, the second wavelength conversion layer QDL2 may emit light by converting or shifting a peak wavelength of incident light to another specific peak wavelength. The second wavelength conversion layer QDL2 may convert a part of the blue light emitted from the light emitting element LE into light similar to green light, which is the second light.

The second wavelength conversion layer QDL2 may emit light similar to green light and thus may perform conversion into red light, which is the first light, through the second color filter CF2.

In an embodiment, in the third emission area EA3, only a transparent light-transmissive organic material may be formed in the third opening OP3 such that the blue light emitted from the light emitting element LE may be emitted through the third color filter CF3 as is.

The plurality of color filters CF1, CF2, and CF3 may be disposed on the partition wall PW and the first and second wavelength conversion layers QDL1 and QDL2. The plurality of color filters CF1, CF2, and CF3 may be disposed to overlap the plurality of openings OP1, OP2, OP3 and the first and second wavelength conversion layers QDL1 and QDL2. The plurality of color filters CF1, CF2, and CF3 may include a first color filter CF1, a second color filter CF2, and a third color filter CF3.

The first color filter CF1 may be disposed to overlap the first emission area EA1. In addition, the first color filter CF1 may be disposed on the first opening OP1 of the partition wall PW to overlap the first opening OP1. The first color filter CF1 may transmit the first light emitted from the light emitting element LE and absorb or block the second light and the third light. For example, the first color filter CF1 may transmit light of a blue wavelength band and absorb or block light of other wavelength bands, such as green and red.

The second color filter CF2 may be disposed to overlap the second emission area EA2. In addition, the second color filter CF2 may be disposed on the second opening OP2 of the partition wall PW to overlap the second opening OP2. The second color filter CF2 may transmit the second light and absorb or block the first light and the third light. For example, the second color filter CF2 may transmit light of a green wavelength band and absorb or block light of other wavelength bands, such as blue and red.

The third color filter CF3 may be disposed to overlap the third emission area EA3. In addition, the third color filter CF3 may be disposed on the third opening OP3 of the partition wall PW to overlap the third opening OP3. The third color filter CF3 may transmit the third light and absorb or block the first light and the second light. For example, the third color filter CF3 may transmit light of a red wavelength band and absorb or block light of other wavelength bands, such as blue and green.

A planar area of each of the plurality of color filters CF1, CF2, and CF3 may be larger than a planar area of each of the plurality of emission areas EA1, EA2, and EA3. For example, the first color filter CF1 may have a larger planar area than the first emission area EA1. The second color filter CF2 may have a larger planar area than the second emission area EA2. The third color filter CF3 may have a larger planar area than the third emission area EA3. However, the present disclosure is not limited thereto, and, in an embodiment, a planar area of each of the plurality of color filters CF1, CF2, and CF3 may be the same as a planar area of each of the plurality of emission areas EA1, EA2, and EA3.

Referring to FIG. 6, the light blocking member BK may be disposed on the partition wall PW. The light blocking member BK may overlap the non-emission area NEA to block transmission of light. The light blocking member BK may be disposed approximately in a lattice shape in a plan view similar to the bank BNL or the partition wall PW. The light blocking member BK may be disposed to overlap the bank BNL, the first organic layer FOL, and the partition wall PW, and may not overlap the emission areas EA1, EA2, and EA3.

In an embodiment, the light blocking member BK may contain an organic light blocking material, and may be formed by a process of coating and exposing the organic light blocking material. The light blocking member BK may include a dye or a pigment having a light blocking property, and may be a black matrix. At least a part of the light blocking member BK may overlap the adjacent color filters CF1, CF2, and CF3, and the color filters CF1, CF2, and CF3 may be disposed on at least a part of the light blocking member BK.

The passivation layer PTL may be disposed on the plurality of color filters CF1, CF2, and CF3 and the light blocking member BK. The passivation layer PTL may be disposed on an uppermost portion of the display device 10 to protect the lower plurality of color filters CF1, CF2, and CF3 and the light blocking member BK. A surface, for example, a bottom surface of the passivation layer PTL may be in contact with a top surface of each of the plurality of color filters CF1, CF2, and CF3 and the light blocking member BK.

The passivation layer PTL may include an inorganic insulating material to protect the plurality of color filters CF1, CF2, and CF3 and the light blocking member BK. For example, the first passivation layer PTL may include silicon oxide (SiOx), silicon nitride (SiNx), silicon oxynitride (SiOxNy), aluminum oxide (AlxOy), aluminum nitride (AlN), or the like, but is not limited thereto. The first passivation layer PTL may have a certain thickness (e.g., a predetermined thickness), for example, in a range of 0.01 μm to 1 μm. However, the present disclosure is not limited thereto.

Figure 9:
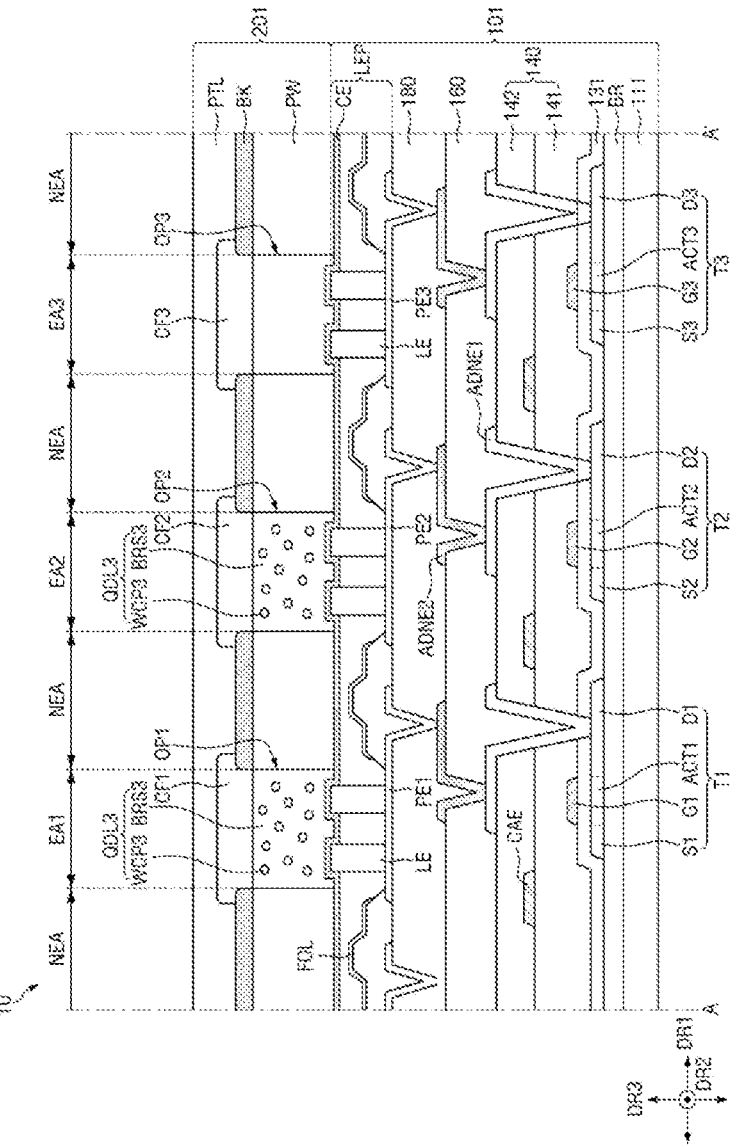
FIG. 9 is a cross-sectional view schematically illustrating a cross section A-A' of FIG. 2 according to another embodiment of the present disclosure.

FIG. 9 is a cross-sectional view schematically illustrating a cross section A-A' of FIG. 2 according to another embodiment.

Referring to FIG. 9, a third wavelength conversion layer QDL3 may be disposed in each of the first and second openings OP1 and OP2.

The third wavelength conversion layer QDL3 may emit light by converting or shifting the peak wavelength of incident light to another specific peak wavelength. The third wavelength conversion layer QDL3 may convert a part of the first blue light emitted from the light emitting element LE into the fourth yellow light. In the third wavelength conversion layer QDL3, the first light and the fourth light may be mixed to emit a fifth white light. The fifth light is converted into the first light through the first color filter CF1 and is converted into the second light through the second color filter CF2.

The third wavelength conversion layer QDL3 may be disposed in each of the first and second openings OP1 and OP2, and may be disposed to be spaced apart from each other. That is, the third wavelength conversion layer QDL3 may be formed of an island pattern in a shape of dots spaced apart from each other. For example, the third wavelength conversion layer QDL3 may be disposed only in each of the first opening OP1 and the second opening OP2, in a one-to-one correspondence. In addition, the third wavelength conversion layer QDL3 may be disposed to overlap each of the first emission area EA1 and the second emission area EA2. In an embodiment, each of the third wavelength conversion layers QDL3 may completely overlap the first emission area EA1 and the second emission area EA2, respectively.

The third wavelength conversion layer QDL3 may include a third base resin BRS3 and third wavelength conversion particles WCP3. The third base resin BRS3 may contain a light-transmissive organic material. For example, the third base resin BRS3 may contain epoxy resin, acrylic resin, cardo resin, or imide resin.

The third wavelength conversion particle WCP3 may convert the first light incident from the light emitting element LE into the fourth light. For example, the third wavelength conversion particle WCP3 may convert light of a blue wavelength band into light of a yellow wavelength band. The third wavelength conversion particle WCP3 may be a quantum dot (QD), a quantum rod, a fluorescent material, or a phosphorescent material. For example, a quantum dot may be a particulate material that emits light of a specific color when an electron transitions from a conduction band to a valence band.

As a thickness of the third wavelength conversion layer QDL3 increases in the third direction DR3, the content of the third wavelength conversion particles WCP3 included in the wavelength conversion layer QDL increases, such that the light conversion efficiency of the third wavelength conversion layer QDL3 may increase. Accordingly, in an embodiment, the thickness of the third wavelength conversion layer QDL3 is set in consideration of the light conversion efficiency of the third wavelength conversion layer QDL3.

In the above-described third wavelength conversion layer QDL3, a part of the first light emitted from the light emitting element LE may be converted into fourth light in the third wavelength conversion layer QDL3. The third wavelength conversion layer QDL3 may emit white fifth light by mixing the first light and the fourth light. In an embodiment, for the fifth light emitted from the third wavelength conversion layer QDL3, the first color filter CF1 to be described later may transmit only the first light, and the second color filter CF2 may transmit only the second light. Accordingly, the light emitted from the wavelength conversion member 201 may be the red and green light of the first light and the second light. In an embodiment, in the third emission area EA3, only a transparent light-transmissive organic material may be formed in the third opening OP3 such that the blue light emitted from the light emitting element LE may be emitted through the third color filter CF3 as is. Accordingly, full colors may be produced.

Figure 10:
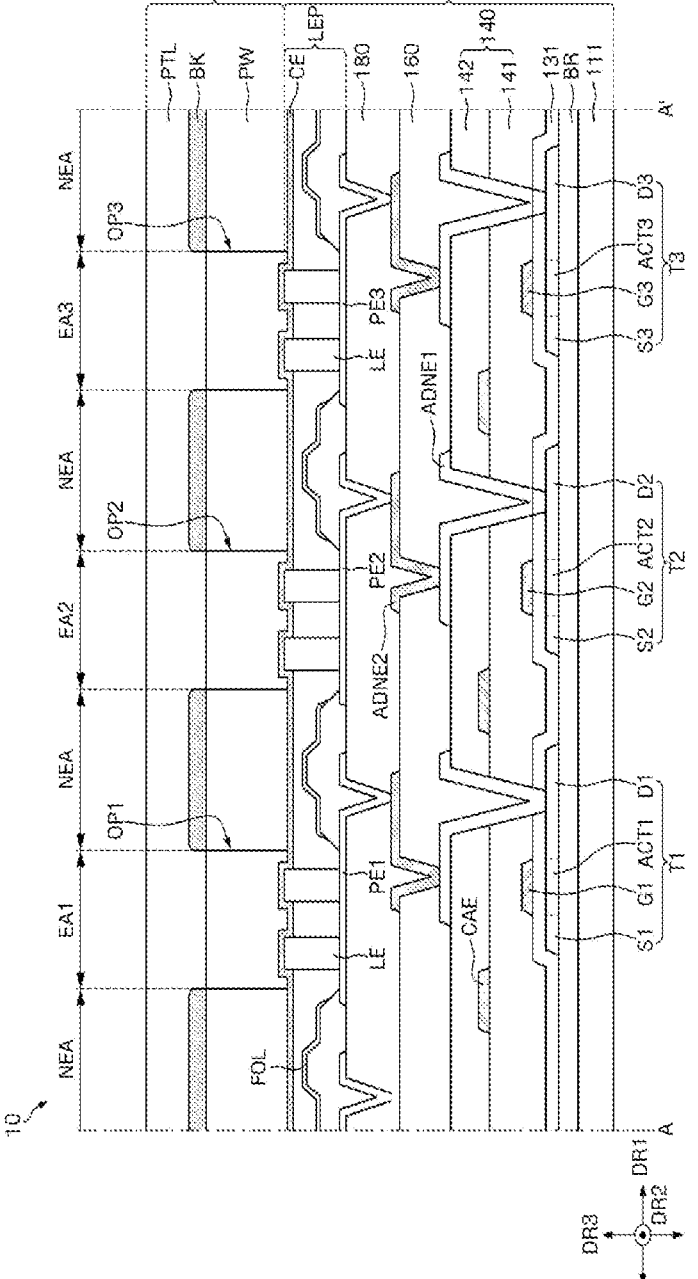
FIG. 10 is a cross-sectional view schematically illustrating a cross section A-A' of FIG. 2 according to another embodiment of the present disclosure.

FIG. 10 is a cross-sectional view schematically illustrating a cross section A-A' of FIG. 2 according to another embodiment.

As described above, the color of the light emitted from the active layer MQW of each light emitting element LE may vary according to the content of indium (In). As the content of indium (In) increases or becomes higher, the wavelength band of light emitted by the active layer may shift to a red wavelength band, and as the content of indium (In) decreases or becomes lower, the wavelength band of light emitted by the active layer may shift to a blue wavelength band. Accordingly, when the content of indium (In) in the active layer MQW of each light emitting element LE formed in the first emission area EA1 is 25% or more, a first light in a red wavelength band with the main peak wavelength in a range of approximately 600 nm to 750 nm may be emitted.

When the content of indium (In) in the active layer MQW of each light emitting element LE formed in the second emission area EA2 is 25%, a second light in a green wavelength band with the main peak wavelength in a range of approximately 480 nm to 560 nm may be emitted.

When the content of indium (In) in the active layer MQW of each light emitting element LE formed in the third emission area EA3 is 15% or less, the active layer MQW may emit a third light in a blue wavelength band with a main peak wavelength in a range of approximately 370 nm to 460 nm.

Each light emitting element LE formed in the first emission area EA1 may emit a first light of a red wavelength band, each light emitting element LE formed in the second emission area EA2 may emit a second light of a green wavelength band, and each light emitting element LE formed in the third emission area EA3 may emit a third light of a blue wavelength band. In this case, the color filters CF1, CF2, and CF3 may not be formed.

Figure 11:
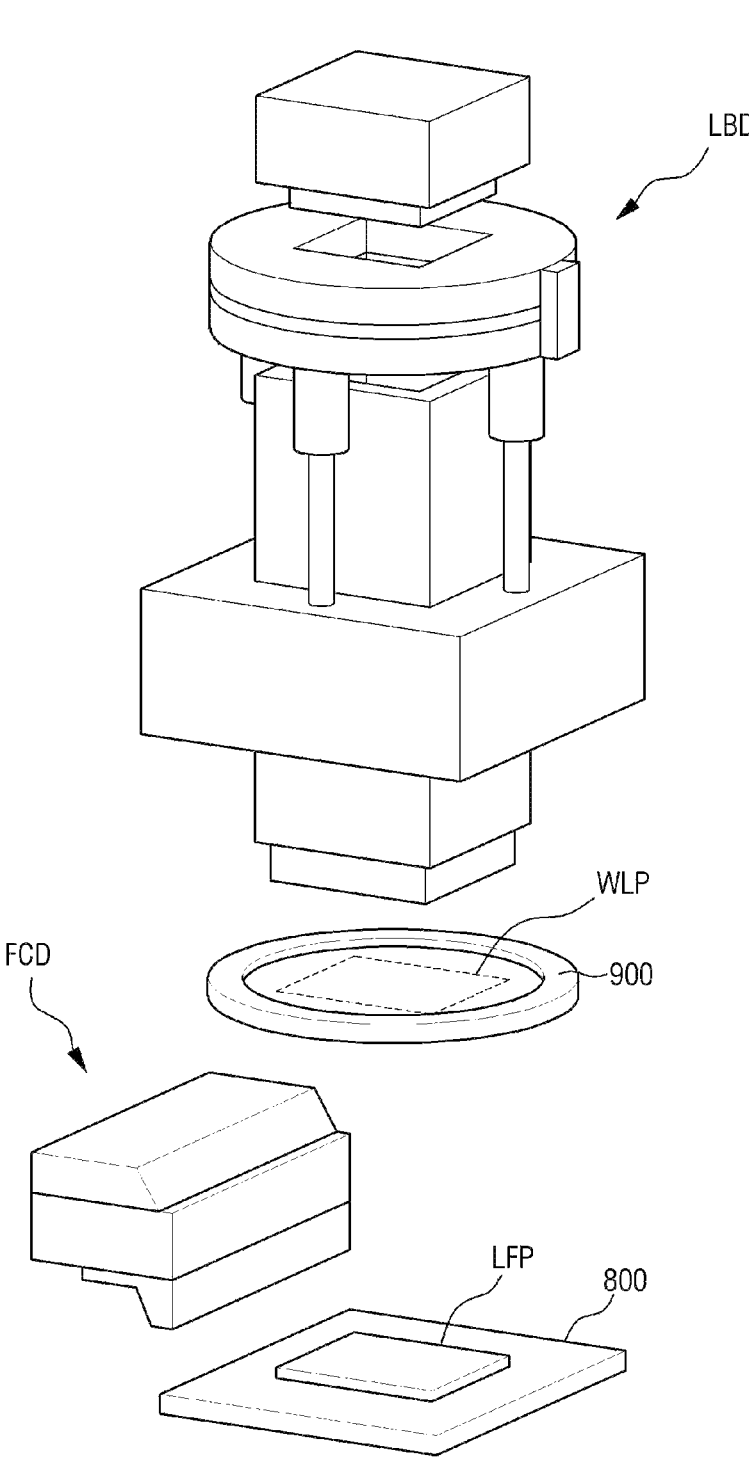
FIG. 11 is a perspective view schematically illustrating an apparatus for fabricating a display panel according to an embodiment of the present disclosure.

FIG. 11 is a perspective view schematically illustrating an apparatus for fabricating a display panel according to an embodiment.

Referring to FIG. 11, an apparatus for fabricating a display panel includes a loading module 800, a solvent application module FCD, a wafer fixing module 900, and an element transfer module LBD.

The loading module 800 may be formed in a polygonal flat plate shape, such as a square shape, a rectangular shape, or the like. However, the loading module 800 may be formed in a flat plate shape such as a circular shape, an elliptical shape, or the like according to a shape of a large-area fabricating substrate LFP or a wafer. Herein, an example in which the loading module 800 is formed in a rectangular flat plate shape will be described.

The large-area fabricating substrate LFP that is fabricated and separated into a plurality of display panels may be loaded and fixed on a loading surface of the loading module 800. When the large-area fabricating substrate LFP is loaded on an upper or front loading surface, the loading module 800 adsorbs a rear surface of the large-area fabricating substrate LFP to fix the large-area fabricating substrate LFP to the loading surface. In addition, the loading module 800 may apply heat to the rear surface of the large-area fabricating substrate LFP. In an embodiment, the loading module 800 may include a heating member or be directly connected to the heating member.

The solvent application module FCD applies a metal bonding solvent, such as flux, on the large-area fabricating substrate LFP. The solvent application module FCD applies the metal bonding solvent to a front surface of the large-area fabricating substrate LFP while moving in a horizontal direction to the large-area fabricating substrate LFP in the front direction of the large-area fabricating substrate LFP. In another embodiment, the solvent application module FCD may apply a metal bonding solvent, such as flux, to the front surface of the large-area fabricating substrate LFP using a spindle method or a rolling method.

The element transfer module LBD transfers the plurality of light emitting elements LE onto a large-area fabricating substrate LFP coated with the metal bonding solvent. In an embodiment, the element transfer module LBD may transfer at least one integrated circuit onto the large-area fabricating substrate LFP coated with the metal bonding solvent. For example, the element transfer module LBD may transfer at least one light emitting chip or a circuit chip, such as a microprocessor, onto the large-area fabricating substrate LFP.

The element transfer module LBD may be disposed in a direction perpendicular to the large-area fabricating substrate LFP in a front direction of the loading module 800. The element transfer module LBD may transfer the plurality of light emitting elements LE onto the large-area fabricating substrate LFP by pressing a rear surface of a transfer film or a wafer WFP on which the plurality of light emitting elements LE is arranged. Then, the element transfer module LBD irradiates laser light onto the large-area fabricating substrate LFP on which the plurality of light emitting elements LE are transferred such that the light emitting elements LE are adhered to the large-area fabricating substrate LFP. As another example, in a state in which circuit chips, such as a microprocessor or a light emitting chip, are arranged on the wafer WLP, the element transfer module LBD presses the rear surface of the wafer WLP to transfer a light emitting chip or a circuit chip onto the large-area fabricating substrate LFP.

While the light emitting elements LE and the like are transferred and adhered to the large-area fabricating substrate LFP, the metal bonding solvent applied on the large-area fabricating substrate LFP may flow and be discharged to the bottom of the loading module 800 through a groove type discharge path formed in the loading module 800.

Specific structures of the wafer fixing module 900 which fixes the wafer WLP in a state in which the plurality of light-emitting elements LE is arranged, the element transfer module LBD and the loading module 800 will be described in further detail with reference to the accompanying drawings.

Figure 12:
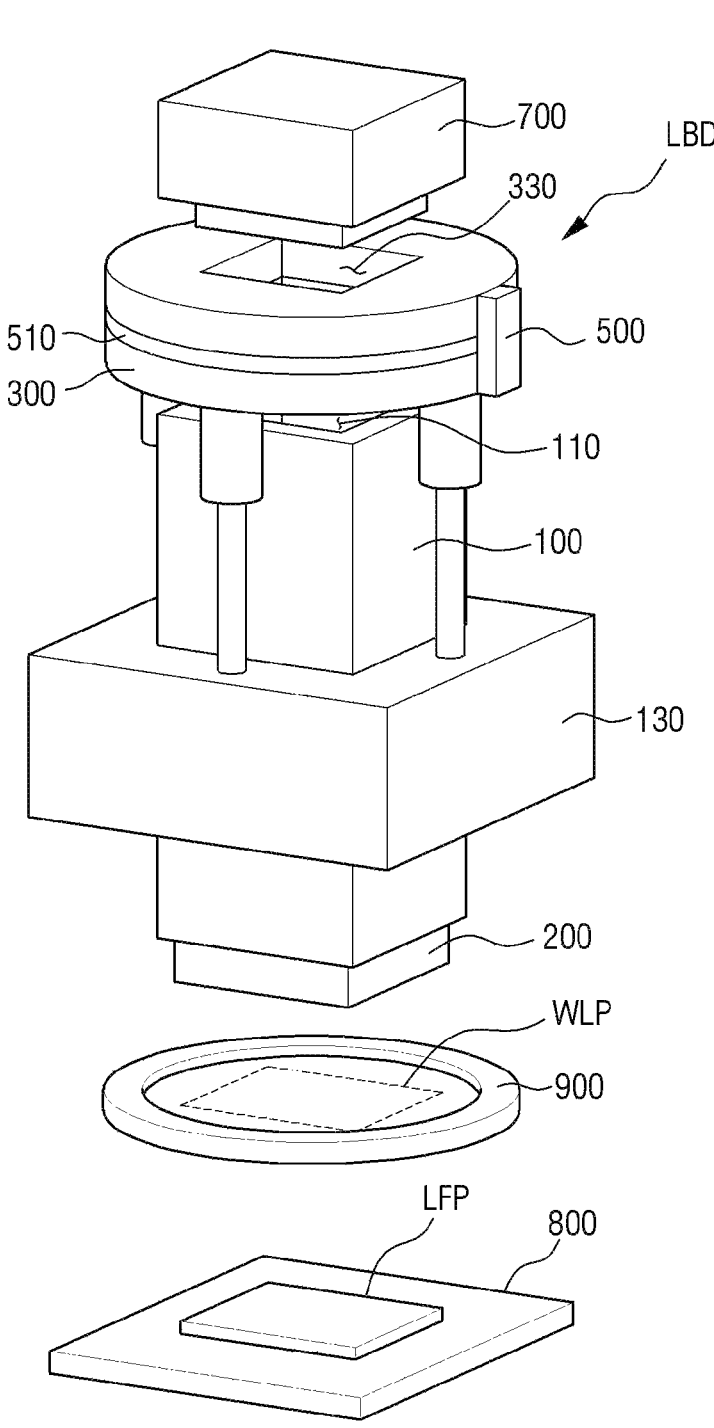
FIG. 12 is a perspective view schematically illustrating an element transfer module, a wafer fixing module, and a loading module shown in FIG. 11.

FIG. 12 is a perspective view schematically illustrating an element transfer module, a wafer fixing module, and the loading module shown in FIG. 11. In addition, FIG. 13 is a cross-sectional view showing structures of the element transfer module, the wafer fixing module, and the loading module shown in FIG. 12.

Figure 13:
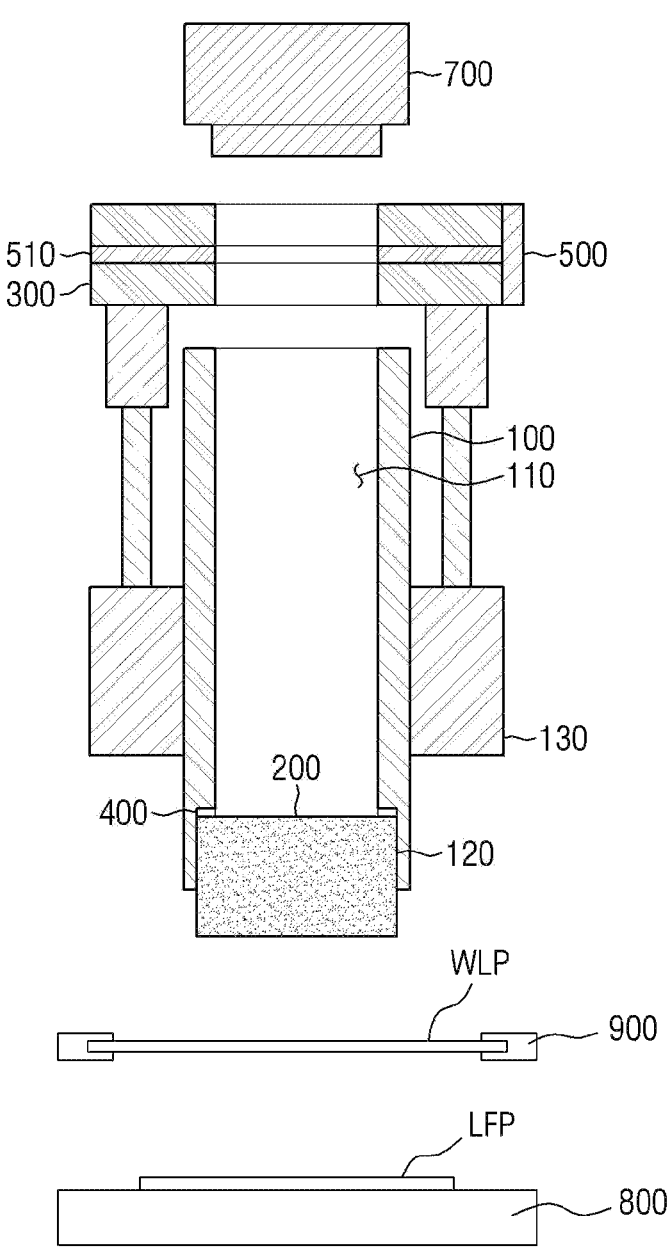
FIG. 13 is a cross-sectional view showing structures of the element transfer module, the wafer fixing module, and the loading module shown in FIG. 12.

Referring to FIGS. 12 and 13, first, the element transfer module LBD includes a transfer member 100, a pressing header 200, a fixing frame 130, a transfer driving member 300, and a laser irradiation member 700.

In an embodiment, the transfer member 100 of the element transfer module LBD is formed in a polygonal tubular shape in which an opening 110 shaped in a polygonal shape, such as a quadrilateral shape or a circular shape, is formed therein. In another embodiment, the transfer member 100 may be formed in a cylindrical shape. The transfer member 100 is moved in a pressing direction facing the large-area fabricating substrate LFP and the loading module 800. The pressing header 200 is coupled and fixed to a fixing portion 120 formed in the pressing direction in which the transfer member 100 moves. Herein, an example in which the transfer member 100 is formed in a quadrilateral tubular shape having the quadrilateral opening 110 will be described. Further, the transfer member 100 may be disposed in a vertical direction from the ground, and a downward direction toward the ground may be the pressing direction of the transfer member 100. In another embodiment, an upward direction opposite to the ground may be a detaching direction of the transfer member 100.

Referring to FIG. 13, the fixing portion 120 into which the pressing header 200 is inserted and fixed is formed at an end of the transfer member 100 disposed in the downward pressing direction. An insertion hole into which the pressing header 200 is inserted and fixed may be formed in the fixing portion 120 of the transfer member 100, and the insertion hole may be formed as a polygonal hole, such as a quadrilateral hole, or a cylindrical hole, according to the shape of the outer circumferential surface of the pressing header 200. Accordingly, an upper surface of the pressing header 200 and an outer circumferential surface of the pressing header 200 in the lateral direction may be inserted into and fixed to the insertion hole formed in the fixing portion 120 of the transfer member 100.

An inner diameter of the insertion hole into which the pressing header 200 is inserted may be formed to be wider than an inner diameter of the opening 110 itself of the transfer member 100. In an embodiment, an inner width of the insertion hole may be formed to be wider or greater than the inner width of the opening 110 of the transfer member 100. Accordingly, a stepped portion is formed inside the fixing portion 120 due to the difference in inner diameter between the opening 110 of the transfer member 100 and the insertion hole.

The pressing header 200 is formed of a transparent member, such as light-transmitting quartz or glass, and is inserted into and fixed to the insertion hole formed in the fixing portion 120 of the transfer member 100. In particular, the transparent pressing header 200 may be formed in a hexahedral shape, a regular cube shape, a cylindrical shape, or a columnar shape corresponding to the shape and size of the insertion hole formed in the fixing portion 120 of the transfer member 100.

The pressing header 200 may move in the pressing direction that is the downward direction, or may move in the detaching direction that is the upward direction, similarly to the transfer member 100, while being inserted into the fixing portion 120 of the transfer member 100. For example, the pressing header 200 made of a transparent material may move in the pressing direction similarly to the transfer member 100 and press the transfer film or the wafer WLP disposed in the pressing direction. Laser light applied in the downward direction that is the pressing direction from the upward direction that is the rear surface direction may pass through the pressing header 200 made of a transparent material and be emitted.

The fixing frame 130 may be attached or assembled to the outer surface of the transfer member 100. The fixing frame 130 may also be integrally formed with the transfer member 100. The fixing frame 130 is formed to protrude from the outer surface of the transfer member 100. The fixing frame 130 may protrude in a quadrilateral shape or a hemispherical shape while surrounding the outer surface of the transfer member 100. The rear or outer surface of the fixing frame 130 is coupled to the transfer driving member 300. The pressing header 200 and the transfer member 100 as well as the fixing frame 130 are moved in the downward pressing direction or the upward detaching direction by the driving of the transfer driving member 300.

The transfer driving member 300 includes a flat plate type support frame and pressure controllers coupled to the flat plate type support frame. The length of each pressure controller may be controlled by adjusting the pressure in a pneumatic or hydraulic manner. The transfer driving member 300 moves the pressing header 200 and the transfer member 100 as well as the fixing frame 130 using the plurality of pressure controllers. The pressure controllers of the transfer driving member 300 are disposed under the flat plate type support frame. The lengths of the plurality of pressure controllers are adjusted according to changes in the amount of inner pneumatic pressure or hydraulic pressure. The transfer driving member 300 may move the pressing header 200 and the transfer member 100 as well as the fixing frame 130 in the downward pressing direction or in the upward direction that is the opposite direction thereof by changing the length of each pressure controller.

In an embodiment, the element transfer module LBD may further include a pressure sensing module 400, a gradient setting module 500, and a gradient control module 510.

As described above, steps are formed inside the fixing portion 120 according to the difference in inner diameter between the opening of the transfer member 100 and the insertion hole. The pressure sensing module 400 is disposed on an inner stepped surface of the fixing portion 120. The pressure sensing module 400 may be formed in a quadrilateral ring or an O-ring shape corresponding to the shape and area of the inner stepped portion of the fixing portion 120. In another embodiment, the pressure sensing modules 400 may be individually separated and disposed separately in plural on the inner stepped surface of the fixing portion 120. With the pressure sensing module 400 disposed on the inner step of the fixing portion 120, the pressing header 200 may be inserted into and fixed on the insertion hole of the fixing portion 120.

The pressure sensing module 400 detects a magnitude of pressure applied to the pressing header 200 using the plurality of pressure sensors, and generates pressure detection signals based on the magnitude of pressure applied to the pressing header 200. The pressure sensing module 400 may transmit the pressure detection signals to the gradient setting module 500.

The gradient setting module 500 compares and analyzes the magnitudes of the pressure detection signals inputted from the pressure sensing module 400 to detect the horizontal gradient of the pressing header 200. Further, horizontal gradient setting values for adjusting the horizontal gradient of the pressing header 200 are calculated. For example, the gradient setting module 500 may detect a magnitude deviation between the pressure detection signals detected by the pressure sensing module 400, and calculate the horizontal gradient setting values of the pressing header 200 that are required to make the magnitude deviation between the pressure detection signals zero. That is, it is possible to calculate the horizontal gradient setting values for controlling the horizontal gradient of the pressing header 200 that are required to make the magnitude deviation between the pressure detection signals zero.

The gradient control module 510 controls the horizontal gradient of the transfer driving member 300 with respect to the flat plate type support frame according to the horizontal gradient setting values set by the gradient setting module 500. As the horizontal gradient of the flat plate type support frame is controlled, the horizontal gradients of the plurality of pressure regulators, the transfer member 100, and the pressing header 200 disposed on the flat plate type support frame are controlled.

An opening hole 330 corresponding to the opening 110 of the transfer member 100 is formed in the flat plate type support frame of the gradient control module 510 and the transfer driving member 300. In an embodiment, the opening hole 330 formed in the gradient control module 510 and the transfer driving member 300 may have the same shape and area as the opening 110 of the transfer member 100 and correspond to each other.

The laser irradiation member 700 is disposed toward the rear surface of the transfer member 100, for example, above the transfer member 100, and irradiates laser light toward the opening hole 330 of the gradient control module 510 and the transfer driving member 300 and the opening 110 of the transfer member 100. The laser light penetrating the opening 330 of the gradient control module 510 and transfer driving member 300 and the opening 110 of the transfer member 100 is emitted toward the front surface of the pressing header 200 through the pressing header 200.

Figure 14:
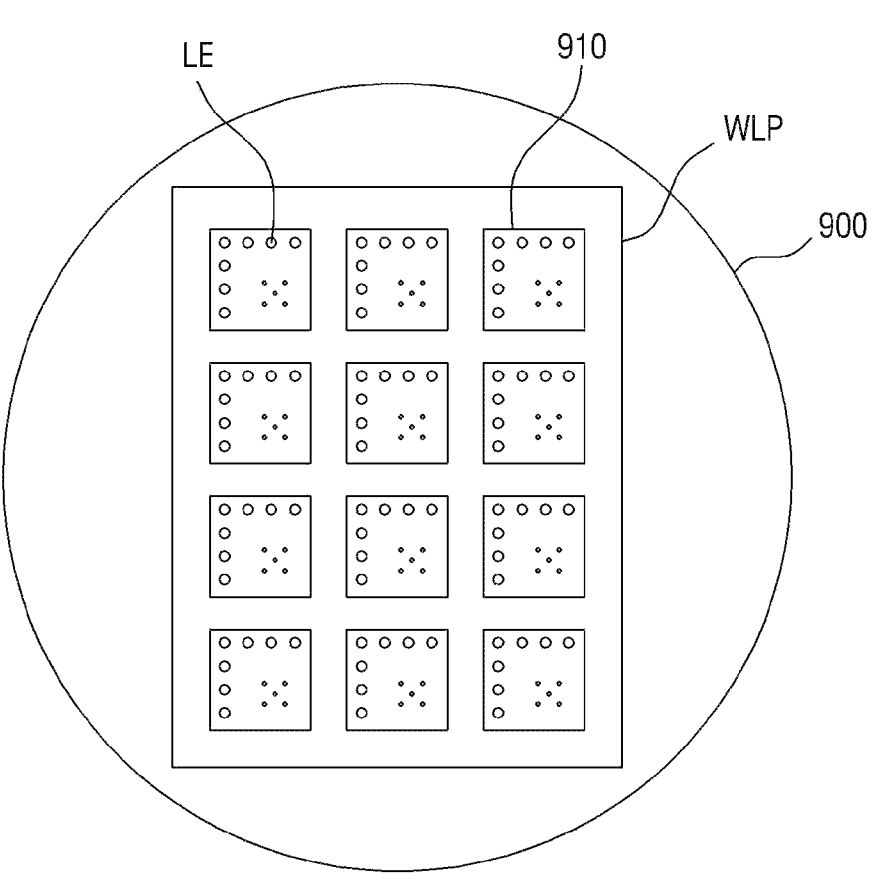
FIG. 14 is a diagram showing a wafer and the wafer fixing module illustrated in FIGS. 12 and 13.

FIG. 14 is a diagram showing a wafer and the wafer fixing module illustrated in FIGS. 12 and 13.

The wafer WLP in which a plurality of light emitting elements LE are arranged and the wafer fixing module 900 for fixing the wafer WLP are disposed in the pressing direction of the element transfer module LBD, for example, in the downward direction of the element transfer module LBD.

A plurality of element disposition areas 910 in which the plurality of light emitting element LE is disposed are set and divided on the wafer WLP, and the plurality of element disposition areas 910 may correspond to a display substrate 101 which is separated from the large-area fabricating substrate LFP, that is, the display panel manufacturing areas, respectively.

The plurality of light emitting elements LE are disposed in the element disposition areas 910 of the wafer WLP, and the wafer fixing module 900 fixes the outer peripheral surface of the wafer WLP. For example, the wafer fixing module 900 may fix the wafer WLP by pressing the outer peripheral surface of the wafer WLP in the front and rear directions. The wafer fixing module 900 may be assembled and fixed in the pressing direction of the element transfer module LBD. The light emitting elements LE disposed on the wafer WLP are transferred to the large-area fabricating substrate LFP by the pressing and transferring process of the element transfer module LBD.

Figure 15:
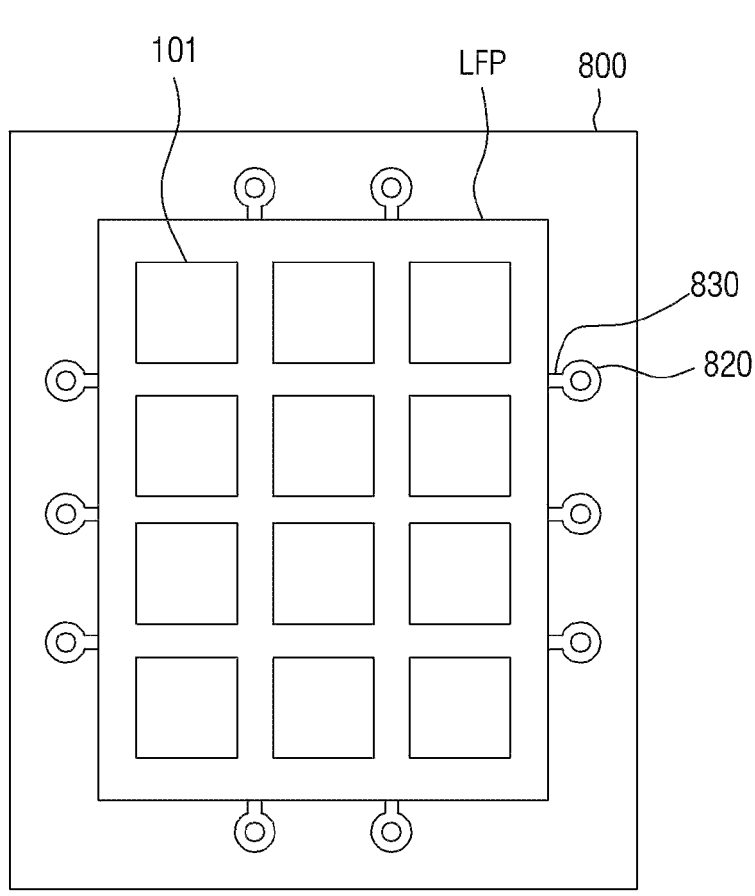
FIG. 15 is a front view showing a loading module and a large-area fabricating substrate disposed on the loading module illustrated in FIGS. 12 and 13.

FIG. 15 is a front view showing a loading module and a large-area fabricating substrate disposed on the loading module illustrated in FIGS. 12 and 13. In addition, FIG. 16 is a front view showing a loading surface of a loading module illustrated in FIG. 15.

Figure 16:
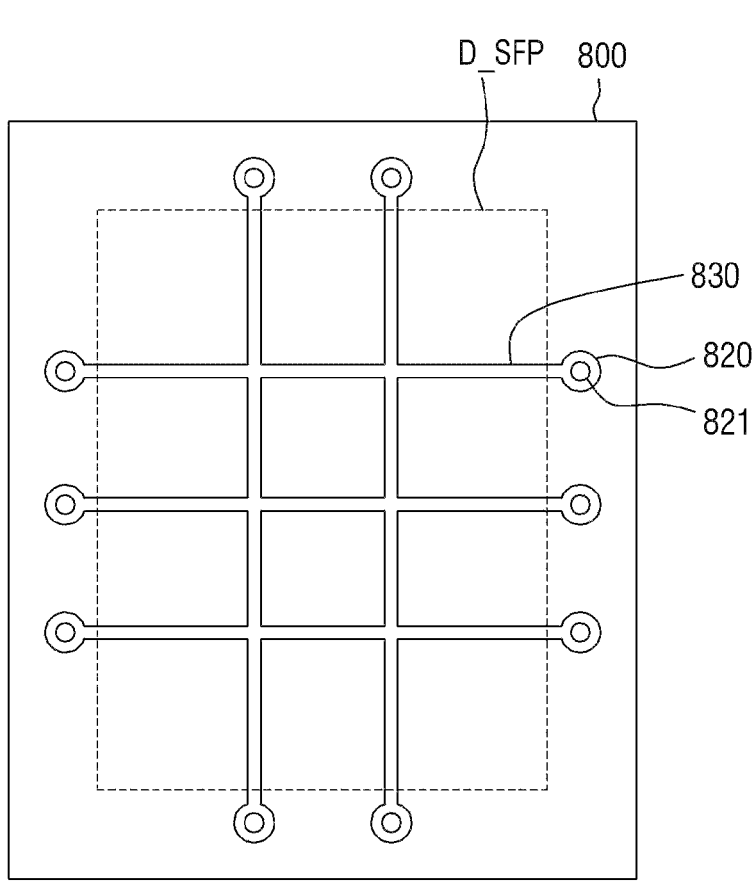
FIG. 16 is a front view showing a loading surface of the loading module illustrated in FIG. 15, according to an embodiment.

Referring to FIGS. 15 and 16, in a loading surface D_SFP of the loading module 800 on which the large-area fabricating substrate LFP is loaded, a groove type discharge path through which the metal bonding solvent of the large-area fabricating substrate LFP flows and is discharged is formed. Here, the groove type discharge path includes a plurality of linear flow grooves 830 forming a flow path of the metal bonding solvent, and a plurality of discharge grooves 820 for discharging the metal bonding solvent flowing through the plurality of linear flow grooves 830. Here, a plurality of discharge holes 821 may be further formed in the plurality of discharge grooves 820 to discharge the metal bonding solvent downward or sideways.

The plurality of linear flow grooves 830 may be formed on the loading surface D_SFP of the loading module 800 in first and second directions (e.g., x-axis and y-axis directions), respectively. Some areas intersecting in the first and second directions may coincide or overlap with each other. Accordingly, the plurality of linear flow grooves 830 may be formed in a straight or curved shape, and may be formed in a mesh type by crossing each other. Also, the plurality of linear flow grooves 830 may be formed in a plurality of separate forms.

In an embodiment, the cross-sections of the plurality of linear flow grooves 830 are formed in a V-shape or U-shape grooves, and the metal bonding solvent is filled into the plurality of linear flow grooves 830 and flows along a longitudinal direction of the linear flow grooves 830. The metal bonding solvent applied on the large-area fabricating substrate LFP may flow along the surface of the large-area fabricating substrate LFP and flow into the plurality of linear flow grooves 830. Also, the metal bonding solvent may flow along the longitudinal direction of the plurality of linear flow grooves 830 to be discharged through the plurality of discharge grooves 820 and the discharge holes 821. In an embodiment, the plurality of discharge grooves 820 may be formed at an end and an opposite end of each of the plurality of linear flow grooves 830. In addition, each of the discharge holes 821 may be formed to pass through a lower direction or a lateral direction of the discharge groove 820.

Figure 17:
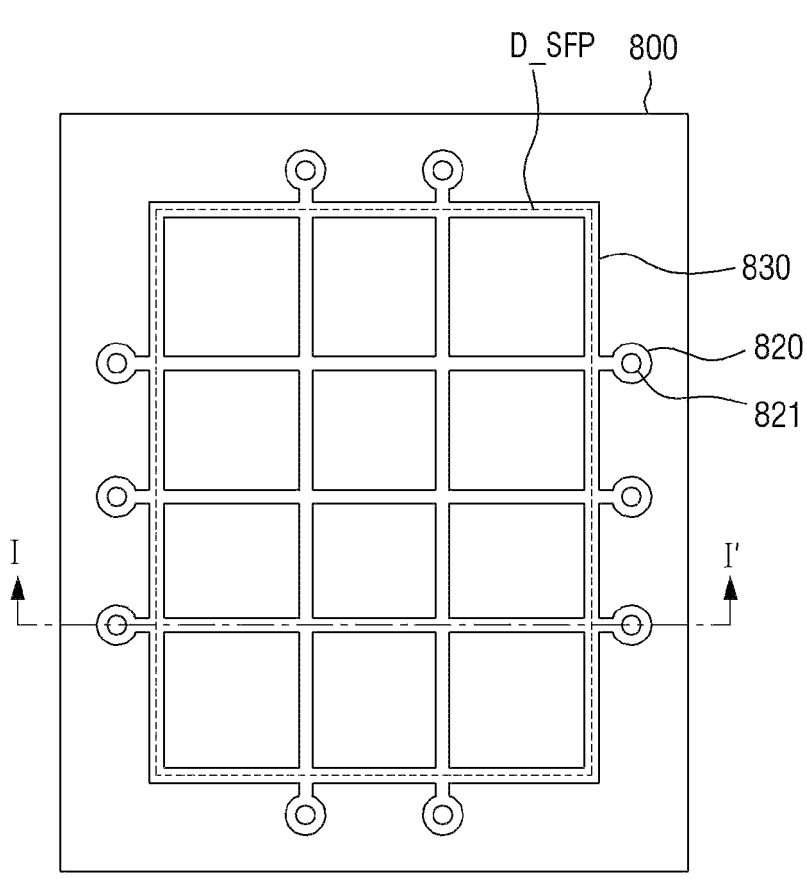
FIG. 17 is a front view showing a loading surface of the loading module illustrated in FIG. 15, according to another embodiment.

FIG. 17 is a front view of another embodiment showing a loading surface of the loading module illustrated in FIG. 15.

Referring to FIG. 17, the plurality of linear flow grooves 830 may be formed in a straight or curved shape along the first and second directions (e.g., x-axis and y-axis directions) on the loading surface D_SFP of the loading module 800, and may overlap and intersect with each other. Accordingly, the plurality of linear flow grooves 830 may be formed in a mesh type, and may also be formed in a plurality of separate forms.

In addition, the plurality of linear flow grooves 830 may be additionally formed at the outer edge of the loading surface D_SFP in a same shape as an outer edge shape of the loading surface D_SFP, corresponding to the area and the outer shape of the loading surface D_SFP of the loading module 800. In another embodiment, the plurality of linear flow grooves 830 may be additionally formed on the outer edge of the loading surface D_SFP in a form surrounding the outer edge shape of the loading surface D_SFP and larger than the area of the loading surface D_SFP of the loading module 800. Accordingly, the metal bonding solvent applied on the large-area fabricating substrate LFP flows along the surface of the large-area fabricating substrate LFP to the outer edge of the large-area fabricating substrate LFP and flows into the plurality of linear flow grooves 830. In addition, the metal bonding solvent of the linear flow groove 830 may be discharged through the plurality of discharge grooves 820 and the discharge hole 821.

Figure 18:
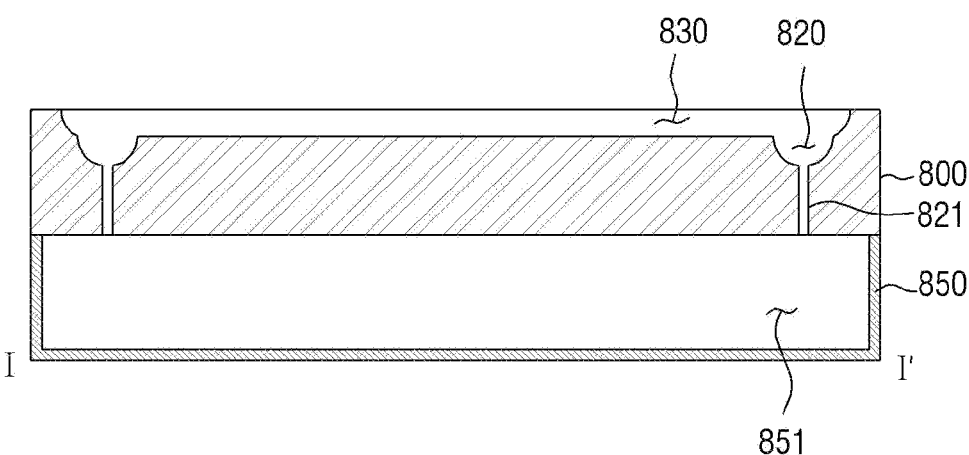
FIG. 18 is a cross-sectional view showing a cross section I-I' of FIG. 17, according to an embodiment.

FIG. 18 is a cross-sectional view showing a cross section I-I' of FIG. 17 according to an embodiment. In addition, FIG. 19 is a cross-sectional view showing a cross section I-I' of FIG. 17 according to another embodiment.

Figure 19:
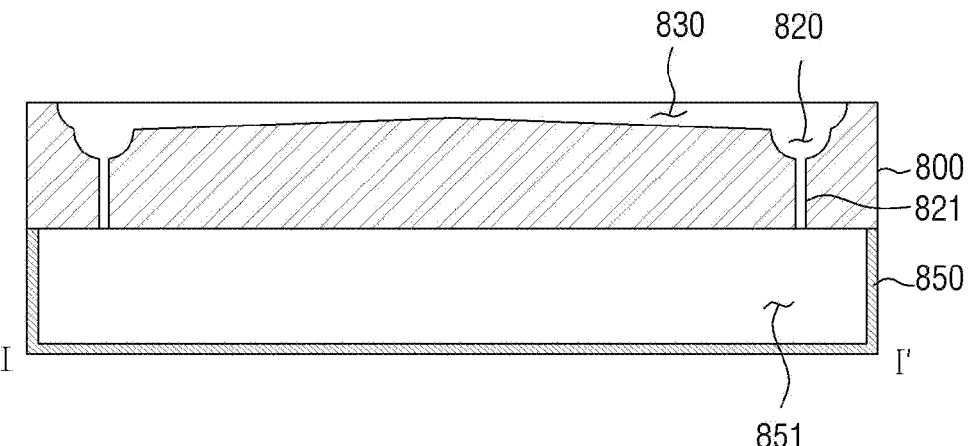
FIG. 19 is a cross-sectional view showing a cross section I-I' of FIG. 17, according to another embodiment.

Referring to FIGS. 18 and 19, the plurality of linear flow grooves 830 may be formed in a straight shape along the first and second directions on the loading surface D_SFP of the loading module 800. In an embodiment, the cross-sections of the plurality of linear flow grooves 830 are formed in a V-shape or U-shape, and the metal bonding solvent may be gathered and flow into the plurality of linear flow grooves 830. Since the discharge grooves 820 are formed respectively on an end and an opposite end of the plurality of linear flow grooves 830, the metal bonding solvent which flows through the plurality of linear flow grooves 830 may be discharged through the discharge groove 820 and the discharge hole 821 formed on the discharge groove 820.

A storage container 850 having a collecting space 851 may be disposed on the bottom, rear, or side surface of the loading module 800 so as to correspond to the passing direction of the discharge hole 821 formed in the discharge groove 820. The metal bonding solvent discharged through each discharge hole 821 may be stored in the collecting space 851 of the storage container 850. The metal bonding solvent storage container 850 may be integrally formed with the loading module 800 or assembled to the loading module 800.

Referring to FIG. 19, the linear flow grooves 830 respectively formed along the first and second directions on the loading surface D_SFP of the loading module 800 may be formed in a shape in which each depth is modified. In an embodiment, each of the plurality of linear flow grooves 830 may be inclined to have a gradient (e.g., a preset gradient). The plurality of linear flow grooves 830 may be formed to have a highest gradient at a center of the loading surface D_SFP and a lowest gradient closer to an edge of the loading surface D_SFP.

Figure 20:
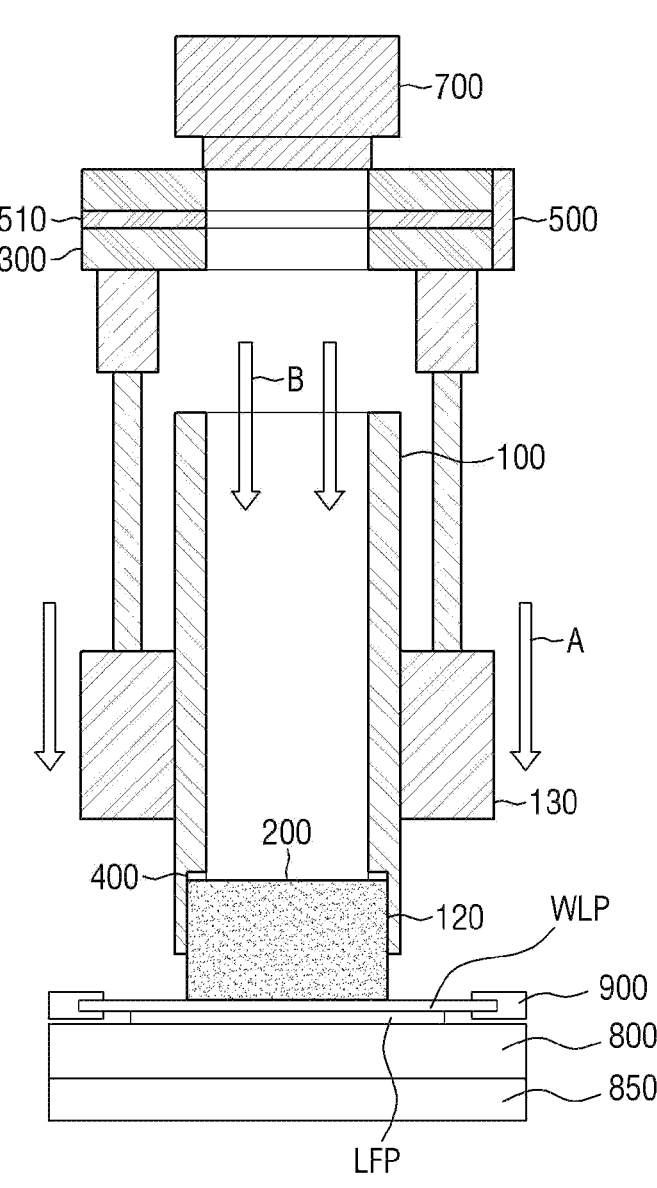
FIG. 20 is a cross-sectional structural view showing a fabricating process of a display panel using the apparatus for fabricating a display panel according to an embodiment of the present disclosure.

FIG. 20 is a cross-sectional structural view showing a fabricating process of a display panel using the apparatus for fabricating a display panel according to an embodiment.

Referring to FIG. 20, the wafer fixing module 900 is disposed on the lower direction which is the pressing direction of the pressing header 200 and the element transfer module LBD.

The wafer WLP on which the plurality of light emitting elements LE are formed is fixed to the wafer fixing module 900, and the wafer fixing module 900 fixes the wafer WLP such that the plurality of light emitting elements LE is disposed in a downward direction. On the loading module 800 in the downward direction facing the wafer fixing module 900, the large-area fabricating substrate LFP to be manufactured and separated into display devices 10 is disposed.

As the transfer member 100 and the pressing header 200 are moved downward by the transfer driving member 300, the pressing header 200 may be in contact with the rear surface of the wafer WLP on which the plurality of light emitting elements LE is formed. The pressing header 200 presses the rear surface of the wafer WLP such that the plurality of light emitting elements LE formed on the wafer WLP is attached to the large-area fabricating substrate LFP.

The laser irradiation member 700 radiates laser light in the direction of the opening hole 330 of the transfer driving member 300 and the opening 110 of the transfer member 100, that is, in a direction of arrow B. Laser light passing through the opening hole 330 of the transfer driving member 300 and the opening 110 of the transfer member 100 is emitted toward the front surface of the pressing header 200 through the pressing header 200. The plurality of light emitting elements LE may be attached to the large-area fabricating substrate LFP, and the plurality of light emitting elements LE may be heated by laser light and transferred to the large-area fabricating substrate LFP.

The element transfer module LBD corrects the gradient of the pressing header 200 and moves the pressing header 200 and the transfer member 100 to transfer the light emitting elements LE onto the large-area fabricating substrate LFP. In an embodiment, the element transfer module LBD may further include the pressure sensing module 400, the gradient setting module 500, and the gradient control module 510.

Referring to FIGS. 12 to 20, the fixing portion 120 into which the pressing header 200 is inserted and fixed is formed at an end of the transfer member 100. The insertion hole into which the pressing header 200 is inserted and fixed may be formed in the fixing portion 120 of the transfer member 100, and the upper surface of the pressing header 200 and the outer circumferential surface of the pressing header 200 in the lateral direction may be inserted into and fixed to the insertion hole formed in the fixing portion 120 of the transfer member 100.

The inner diameter of the insertion hole into which the pressing header 200 is inserted may be formed to be wider than the inner diameter of the opening of the transfer member 100. The inner width of the insertion hole may be formed to be wider or greater than the inner width of the opening of the transfer member 100. Accordingly, a stepped portion may be formed inside the fixing portion 120 due to the difference in inner diameter between the opening of the transfer member 100 and the insertion hole.

The pressure sensing module 400 may be disposed on an inner step of the fixing portion 120. The pressure sensing module 400 may be formed in a quadrilateral ring or an O-ring shape corresponding to the shape and area of the inner stepped portion of the fixing portion 120. In another embodiment, the pressure sensing modules 400 may be individually separated and disposed separately in plural on the inner stepped surface of the fixing portion 120. With the pressure sensing module 400 disposed on the inner step of the fixing portion 120, the pressing header 200 may be inserted into and fixed on the insertion hole of the fixing portion 120. In an embodiment, the pressure sensing module 400 includes a plurality of pressure sensors and at least one signal transmission circuit. The pressure sensing module 400 detects the magnitude of pressure applied to the pressing header 200 using the plurality of pressure sensors, and generates pressure detection signals based on the magnitude of pressure applied to the pressing header 200. The pressure sensing module 400 may transmit the pressure detection signals to the gradient setting module 500 using the signal transmission circuit.

The gradient setting module 500 compares and analyzes the pressing force of the transfer driving member 300 and the magnitudes of the pressure detection signals of the pressure sensing module 400 to detect the horizontal gradient of the pressing header 200. Further, horizontal gradient setting values for controlling the horizontal gradient of the pressing header 200 are calculated. For example, the gradient setting module 500 may detect the magnitude deviation between the pressure detection signals detected by the pressure sensing module 400, and calculate the horizontal gradient setting values of the pressing header 200 that are required to make the magnitude deviation between the pressure detection signals zero. That is, it is possible to calculate the horizontal gradient setting values for controlling the horizontal gradient of the pressing header 200 that are required to make the magnitude deviation between the pressure detection signals zero.

The gradient control module 510 controls the horizontal gradient of the transfer driving member 300 with respect to the flat plate type support frame according to the horizontal gradient setting values set by the gradient setting module 500. As the horizontal gradient of the flat plate type support frame is controlled, the horizontal gradients of the plurality of pressure regulators, the transfer member 100 and the pressing header 200 disposed on the flat plate type support frame are controlled.

The gradient control module 510 is disposed on the rear surface of the flat plate type support frame and includes a plurality of pressure regulators and a plurality of LM guides (linear guides) respectively disposed at corresponding positions. In an embodiment, the gradient control module 510 may include a plurality of magnet springs which supports each of the LM guides, and at least one servo motor which controls the horizontal gradients with respect to the flat plate type support frame and the plurality of pressure controllers by changing each of the arrangement positions of the plurality of LM guides.

In an embodiment, the opening hole 330 corresponding to the opening 110 of the transfer member 100 is formed in the flat plate type support frame of the transfer driving member 300 and the gradient control module 510. The opening hole 330 formed in the gradient control module 510 and the transfer driving member 300 and the opening 110 of the transfer member 100 may correspond to each other and have a same shape and hole area.

Figure 21:
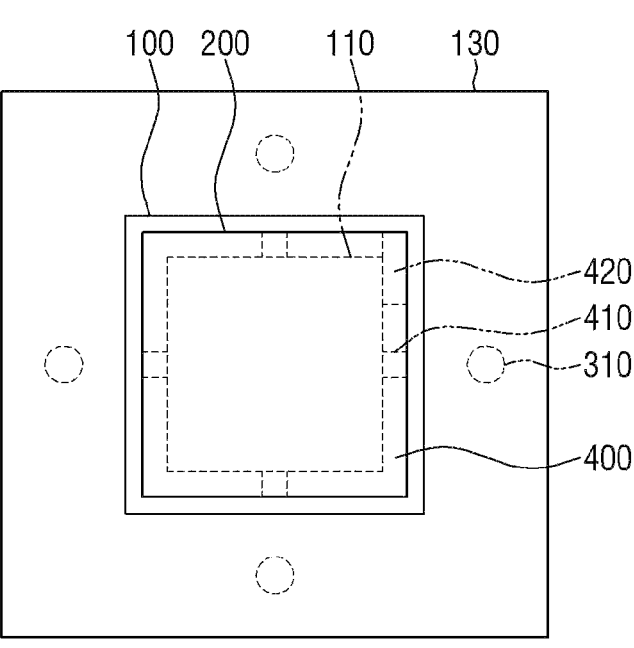
FIG. 21 is a diagram showing lower surfaces of a pressurization header, an attachment member, and a fixing frame of FIGS. 12 to 20 in an upward direction.

FIG. 21 is a configuration diagram showing lower surfaces of a pressurization header, an attachment member, and a fixing frame of FIGS. 12 to 20 in an upward direction.

Referring to FIG. 21, the pressure controllers 310 of the transfer driving member 300 are coupled to the rear surface of the fixing frame 130, such that the pressing header 200 and the transfer member 100 as well as the fixing frame 130 may be moved in the vertical direction by the pressure controllers 310.

The pressure controllers 310 of the transfer driving member 300 may be respectively coupled in 2-axis, 3-axis, or 4-axis directions of the fixing frame 130. For example, four pressure controllers 310 may be respectively coupled in the x-axis, −x-axis, y-axis, and −y-axis directions of the side or rear surface of the fixing frame 130. Lengths of the four pressure controllers 310 may be adjusted in the vertical direction (or forward-backward direction), and the pressing header 200 and the transfer member 100 as well as the fixing frame 130 may be moved in the vertical direction (or forward-backward direction) in response to changes in the lengths of the pressure controllers 310.

In an embodiment, the inner diameter of the insertion hole to which the pressing header 200 is fixed is formed to be wider than the inner diameter of the opening 110 penetrating the inside of the transfer member 100, and the quadrilateral ring-type pressure sensing module 400 may be disposed at the inner stepped portion of the insertion hole.

Referring to FIG. 21, the quadrilateral ring-type pressure sensing module 400 includes a plurality of pressure sensors 410, and at least one signal transmission circuit 420.

The plurality of pressure sensors 410 are respectively disposed at positions in different directions to detect the pressure applied from the pressing header 200 and generate a pressure detection signal according to the magnitude of the detected pressure.

At least one signal transmission circuit 420 transmits first pressure detection signals generated by the plurality of pressure sensors 410 to the gradient setting module 500.

The plurality of pressure sensors 410 may be respectively disposed in 4-axis directions of the insertion hole to which the pressing header 200 is fixed. For example, the plurality of pressure sensors 410 may be respectively disposed in the x-axis, −x-axis, y-axis, and −y-axis directions corresponding to the coupling positions of the pressure controllers 310 coupled to the fixing frame 130. However, a number and arrangement positions of the plurality of pressure sensors 410 are not limited to those illustrated in FIG. 21, and two or more pressure sensors 410 may be disposed in two or more axial directions to be disposed in an axial direction of a polygon, such as a straight line, a triangle, a quadrangle, a pentagon, a hexagon, or the like. In another embodiment, the plurality of pressure sensors 410 may be arranged in a polygonal shape, such as a triangle, a quadrangle, a pentagon, a hexagon, or the like.

At least one signal transmission circuit 420 receives the pressure detection signals from the plurality of pressure sensors 410 in real time, and transmits the first pressure detection signals according to the pressure magnitude to the gradient setting module 500 together with a directional code for each pressure sensor 410. In an embodiment, at least one signal transmission circuit 420 may further include a short-range interface communication circuit for transmitting pressure detection signals in a wired or wireless manner.

Figure 22:
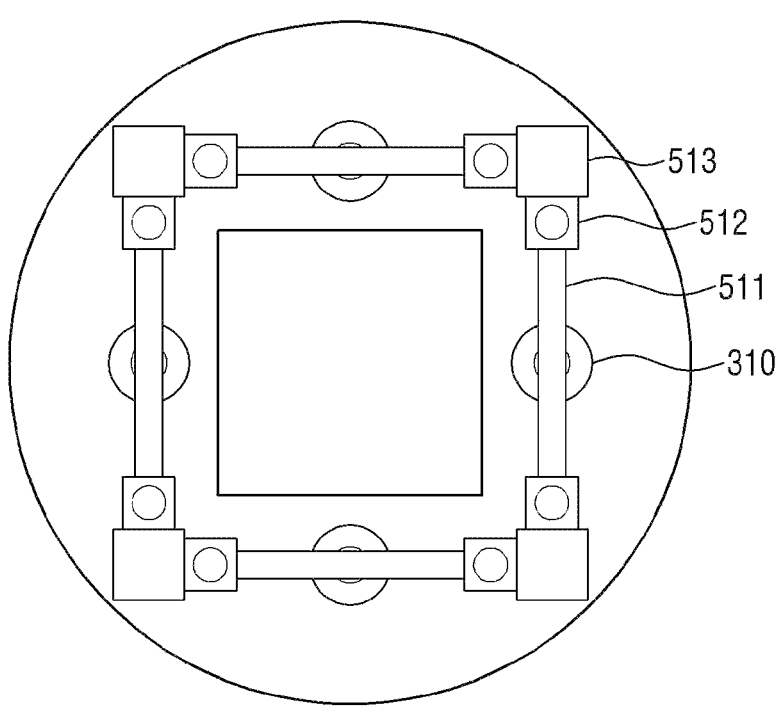
FIG. 22 is a diagram showing a structure, in a plan view, of a gradient control module illustrated in FIGS. 12 to 20.

FIG. 22 is a configuration diagram showing a structure, in a plan view, of a gradient control module illustrated in FIGS. 12 to 20.

Referring to FIG. 22, in an embodiment, the gradient control module 510 includes a plurality of LM guides 511, a plurality of magnet springs 512, and at least one servo motor 513.

The plurality of LM guides 511 are arranged to support the pressure controllers 310 and the flat plate type support frame in a rear surface direction of the pressure controllers

310. In an embodiment, the respective LM guides 511 may be disposed on the flat plate type support frame at positions corresponding to disposition positions of the pressure controllers 310, and may support the pressure controllers 310 in the rear surface direction. When the respective LM guides 511 pressurize the pressure controllers 310 in the rear surface direction, the pressure controllers 310 may be pressurized in the downward direction. On the other hand, when a pressurization force for the pressure controllers 310 is lowered, the pressure controllers 310 may be moved in the upward direction.

The magnet springs 512 are disposed between the LM guides 511 and support at least one side surfaces of the LM guides 511. The respective magnet springs 512 may be rotatably disposed in a helical screw structure to change heights or positions, in the upward and downward directions, of the LM guides 511 supported on side surfaces thereof according to a rotation direction. That is, when each magnet spring 512 rotates in a first horizontal direction (or clockwise direction), at least one LM guide 511 in contact with a side surface of each magnet spring 512 may be moved in the downward direction, which is a disposition direction of the pressure regulator 310. On the other hand, when each magnet spring 512 rotates in a second horizontal direction (or counterclockwise direction), at least one LM guide 511 in contact with a side surface of each magnet spring 512 may be moved in the upward direction in which it becomes distant from the pressure controller 310.

At least one servo motor 513 rotates at least one of the plurality of magnet springs 512 in the first horizontal direction (or clockwise direction) or the second horizontal direction (or counterclockwise direction) in response to the horizontal gradient setting values set by the gradient setting module 500 and the gradient control signals generated by the gradient setting module 500. At least one rotation direction or rotation axis transformation gears may be formed in at least one servo motor 513. At least one servo motor 513 adjusts an amount of rotation of at least one magnet spring 512 based on a magnitude of the gradient control signal. A height of each of the pressure controllers 310 may be adjusted according to a degree of rotation of at least one magnet spring 512 rotating in the first or second horizontal direction.

Figure 23:
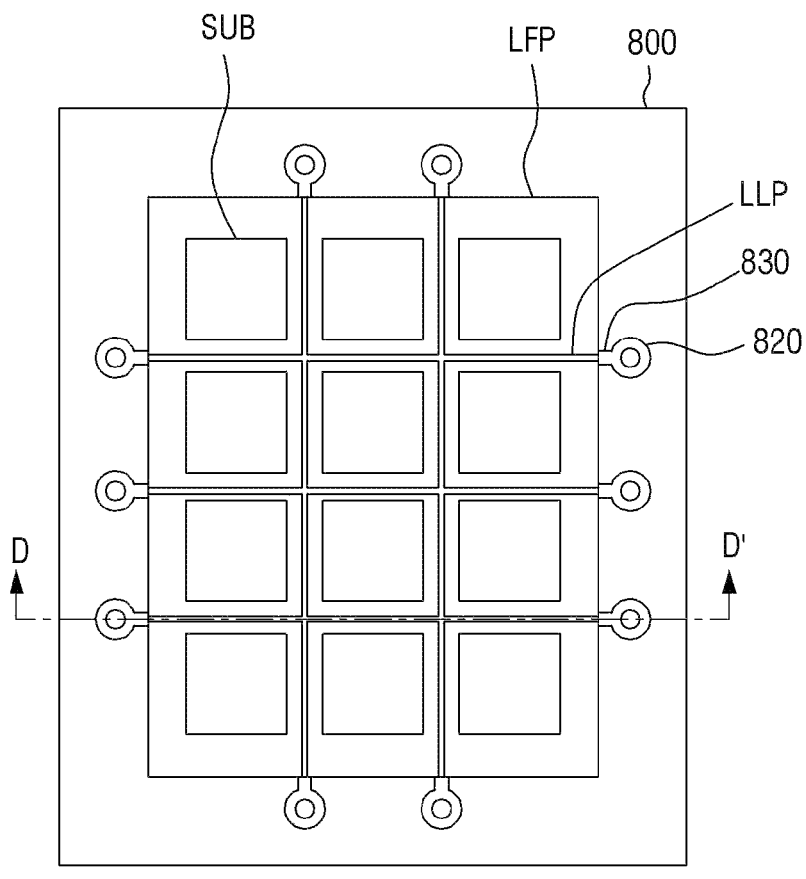
FIG. 23 is a front view of another embodiment showing a loading module and a large-surface fabricating substrate disposed on the loading module illustrated in FIGS. 12 and 13.
Figure 24:
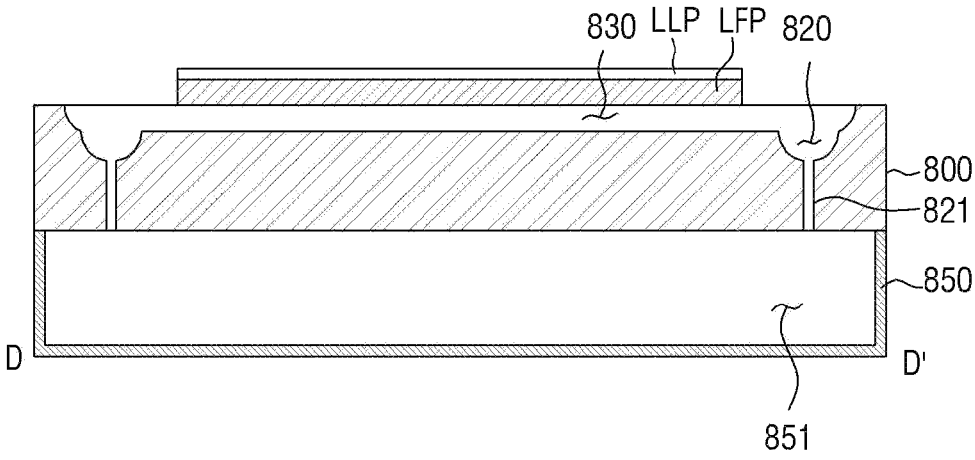
FIG. 24 is a cross-sectional view showing a cross-section D-D' of FIG. 23.

FIG. 23 is a front view showing a loading module and a large-surface fabricating substrate disposed on the loading module illustrated in FIGS. 12 and 13, according to another embodiment; and FIG. 24 is a cross-sectional view showing a cross-section D-D' of FIG. 23.

Referring to FIGS. 23 and 24, the large-area fabricating substrate LFP loaded on the loading surface D_SFP of the loading module 800 includes a plurality of groove lines LLP forming a flow path of the metal bonding solvent applied to the front surface of the large-area fabricating substrate LFP.

The plurality of groove lines LLP may be formed in the first and second directions (e.g., x-axis and y-axis directions) on the front surface of the large-area fabricating substrate LFP. Some areas intersecting in the first and second directions may coincide or overlap with each other. In an embodiment, the plurality of groove lines LLP may be formed in a straight shape, and may be formed in a mesh type by crossing each other. Also, the plurality of groove lines LLP may be formed in a plurality of separate forms.

The plurality of groove lines LLP may be formed on cutting lines where the large-area fabricating substrate LFP is cut into each display panel or display device 10. In addition, the plurality of groove lines LLP may be respectively formed at positions overlapping the plurality of linear flow grooves 830 formed in the loading module 800. Accordingly, the groove lines LLP may be disposed to correspond respectively between the plurality of discharge grooves 820 formed in the loading module 800.

In an embodiment, the cross-sections of the plurality of groove lines LLP are formed in a V-shape or U-shaped groove, and the metal bonding solvent may flow into the plurality groove lines LLP along the plurality groove lines LLP. The metal bonding solvent applied on the large-area fabricating substrate LFP may flow along the surface of the large-area fabricating substrate LFP and flow into the plurality of groove lines LLP. Also, the metal bonding solvent may flow along the longitudinal direction of the groove lines LLP to be discharged through the plurality of linear flow grooves 830, the discharge groves 820, and the discharge holes 821.

Figure 25:
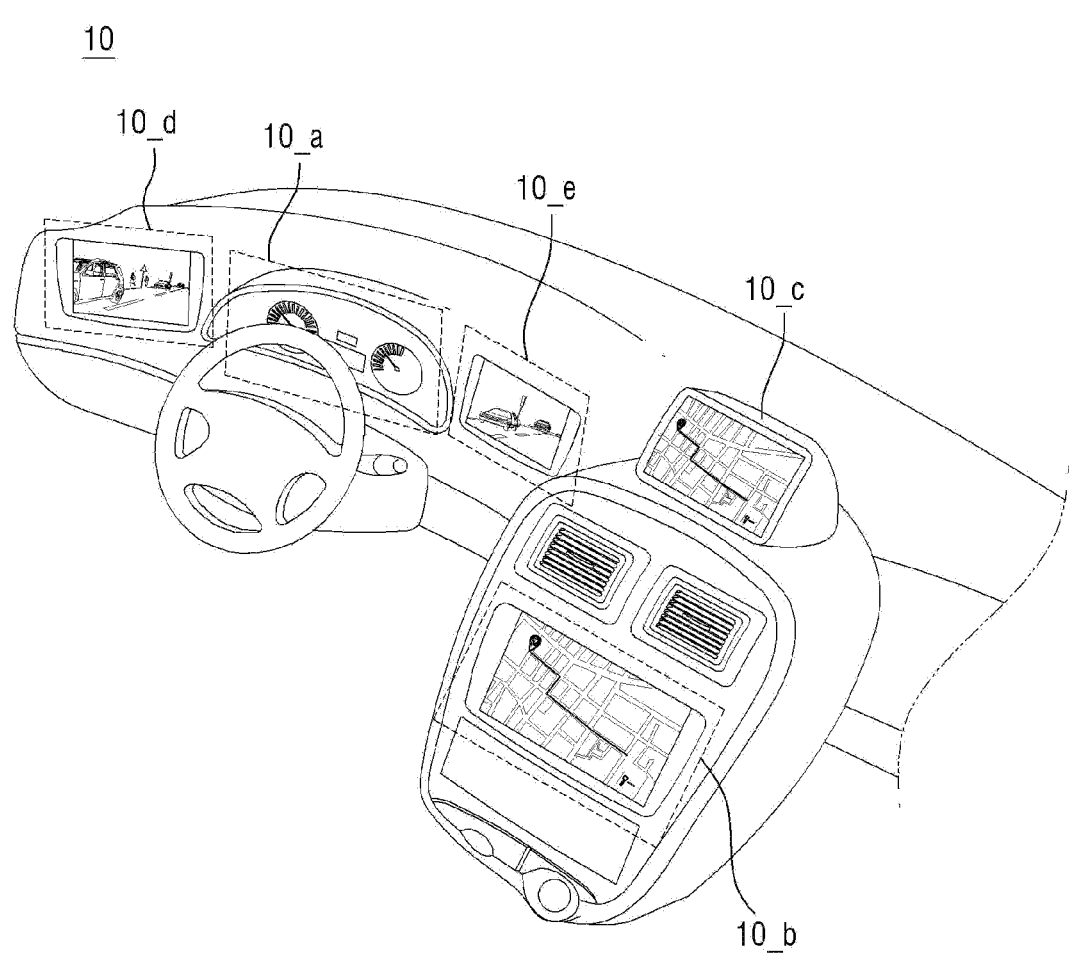
FIG. 25 is a diagram illustrating a vehicle instrument panel and a center fascia including a display device according to an embodiment of the present disclosure.

FIG. 25 is a diagram illustrating a vehicle instrument panel and a center fascia including a display device according to an embodiment.

Referring to FIG. 25, the display substrates or the display panel included in the display device of the present disclosure may be applied as the display device 10 or a display device of a vehicle dashboard. For example, the display devices 10 to which the light emitting elements LE, such as micro LEDs or the like, are applied may be applied to a dashboard 10_a of a vehicle, a center fascia 10_b of a vehicle, or a center information display (CID) 10_c disposed at the dashboard of a vehicle. Further, the display device 10 according to an embodiment may be applied to room mirror displays 10_d and 10_e used instead of a side mirror of a vehicle, a navigation device, or the like.

Figure 26:
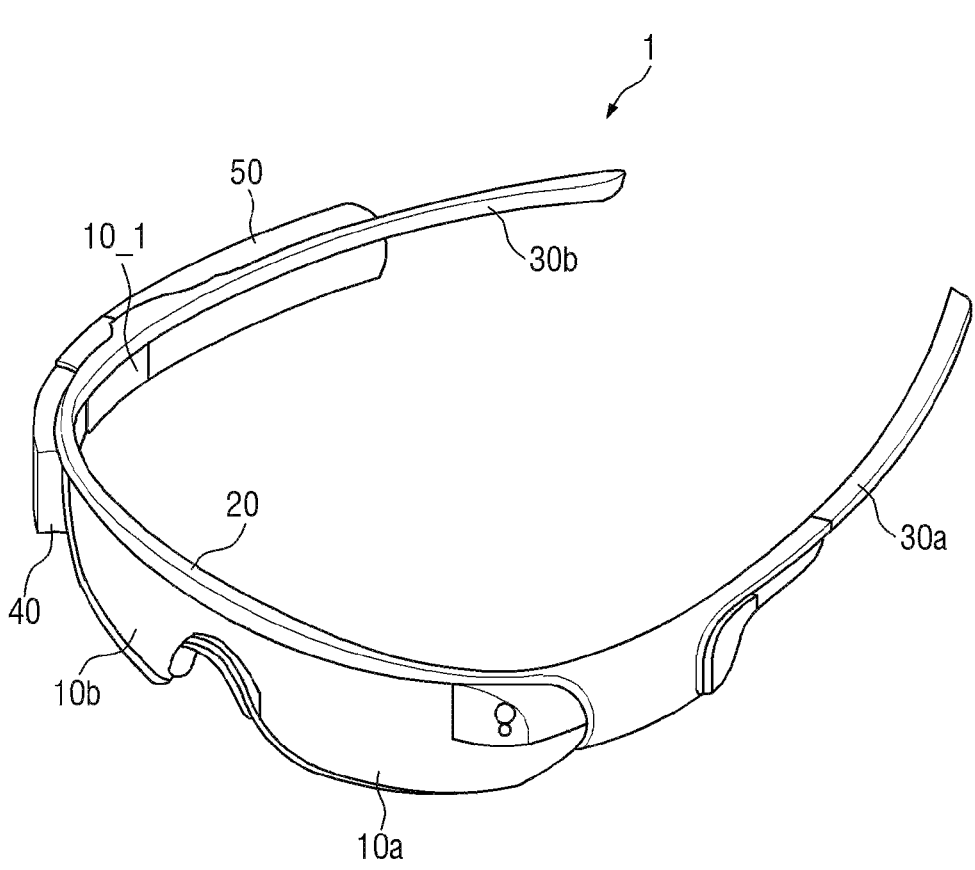
FIG. 26 is a diagram illustrating a glasses-type virtual reality device including a display device according to an embodiment of the present disclosure.
Figure 27:
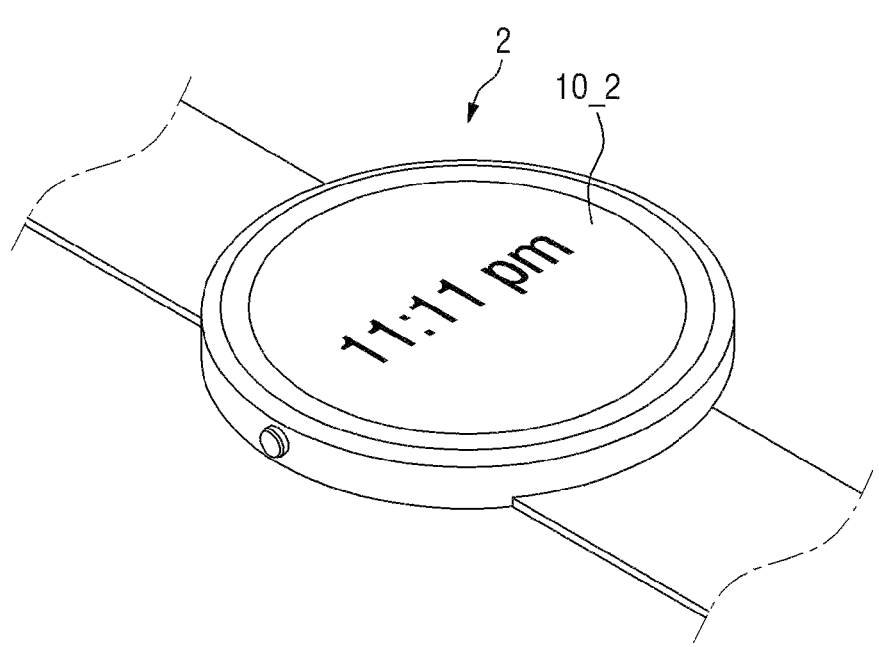
FIG. 27 is a diagram illustrating a watch-type smart device including a display device according to an embodiment of the present disclosure.

FIG. 26 is a diagram illustrating a glasses-type virtual reality device including a display device according to an embodiment. FIG. 27 is an diagram illustrating a watch-type smart device including a display device according to an embodiment.

FIG. 26 illustrates a glasses-type virtual reality device 1 including temples 30a and 30b. The glasses-type virtual reality device 1 according to an embodiment may include a virtual image display device 10_1, a left lens 10a, a right lens 10b, a support frame 20, the temples 30a and 30b, a reflection member 40, and a display device storage 50. The virtual image display device 10_1 may display a virtual image using the micro display substrates 101 illustrated in an embodiment of the present disclosure.

The glasses-type virtual reality device 1 according to an embodiment may be applied to a head mounted display including a head mounted band that may be worn on a head, instead of the temples 30a and 30b. That is, the glasses-type virtual reality device 1 according to an embodiment is not limited to that shown in FIG. 26, and may be applied in various forms to various electronic devices.

Further, as illustrated in FIG. 27, the micro display substrates 101 illustrated in an embodiment of the present disclosure may be applied as a position display device 10_2 of a watch-type smart device 2 that is one of the smart devices.

Figure 28:
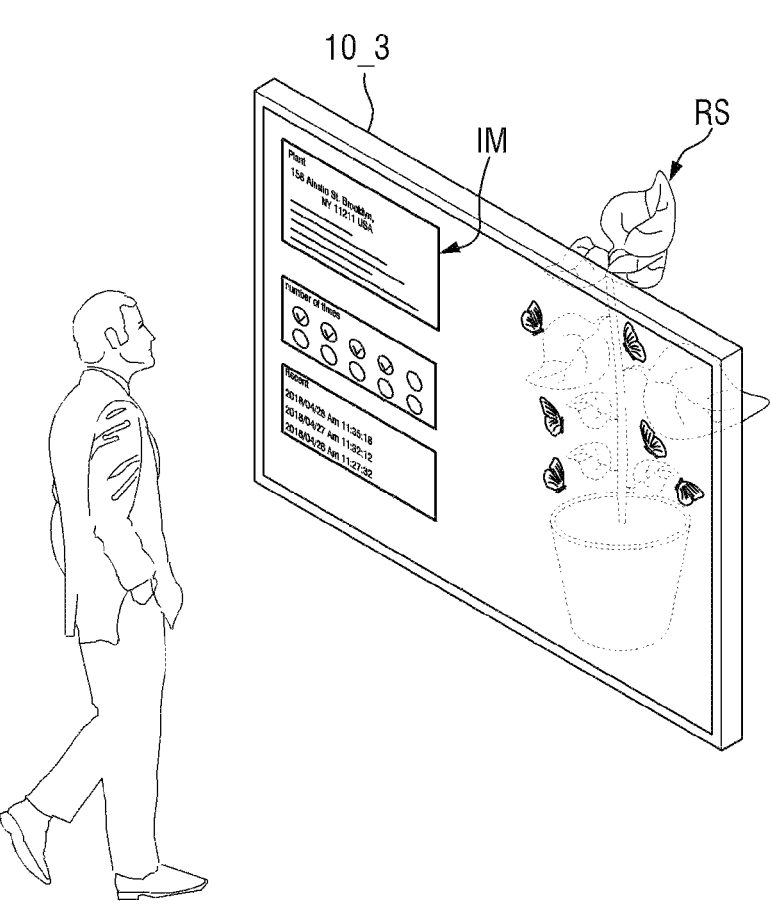
FIG. 28 is a diagram illustrating a transparent display device including a display device according to an embodiment of the present disclosure.

FIG. 28 is a diagram illustrating a transparent display device including a display device according to an embodiment of the present disclosure.

Referring to FIG. 28, the main micro display substrates 101 illustrated in an embodiment of the present disclosure may be applied to a transparent display device 10_3. The transparent display device 10_3 may display an image IM, and also may transmit light. Thus, a user located on the front side of the transparent display device 10_3 can view an object RS or a background on the rear side of the transparent display device 10_3 as well as the image IM displayed on the micro display panel. When the micro display substrate 101 is applied to the transparent display device 10_3, the micro display substrate 101 shown in FIG. 28 may include a light transmitting portion capable of transmitting light or may be made of a material capable of transmitting light.

In concluding the detailed description, those skilled in the art will appreciate that many variations and modifications can be made to the described embodiments without substantially departing from the principles of the present invention. Therefore, the disclosed embodiments of the invention are used in a generic and descriptive sense and not for purposes of limitation.

What is claimed is:

1. An apparatus for fabricating a display panel, the apparatus comprising:
a loading module comprising a loading surface on which a large-area fabricating substrate fabricated and separated into a plurality of display panels is configured to be arranged;
a solvent application module configured to apply a metal bonding solvent onto the large-area fabricating substrate; and
an element transfer module configured to transfer a plurality of light emitting elements or at least one integrated circuit onto the large-area fabricating substrate on which the metal bonding solvent is applied,
wherein the loading surface comprises a groove type discharge path through which the metal bonding solvent applied by the solvent application module flows and is discharged.

2. The apparatus of claim 1, wherein the groove type discharge path comprises:
a plurality of linear flow grooves forming a flow path of the metal bonding solvent; and
a plurality of discharge grooves to discharge the metal bonding solvent flowing through the plurality of linear flow grooves.

3. The apparatus of claim 2, wherein the groove type discharge path further comprises a plurality of discharge holes formed in a lower direction or a side direction of the plurality of discharge grooves to discharge the metal bonding solvent in the lower or side direction.

4. The apparatus of claim 3, further comprising a storage container having a collecting space on a lower, rear surface or side surface of the loading module so as to correspond to the passing direction of a discharge hole formed respectively in the plurality of discharge grooves.

5. The apparatus of claim 2, wherein the plurality of linear flow grooves are formed respectively in first and second directions of the loading surface of the loading module and some areas intersect in the first and second directions to coincide or overlap with each other.

6. The apparatus of claim 5, wherein the plurality of linear flow grooves are additionally formed on an outer edge of the loading surface in a same shape as an outer edge shape of the loading surface corresponding to an area and outer edge shape of the loading surface of the loading module.

7. The apparatus of claim 5, wherein the plurality of linear flow grooves are additionally formed on an outer edge of the loading surface in a shape surrounding the outer edge of the loading surface larger than an area of the loading surface of the loading module.

8. The apparatus of claim 2, wherein the plurality of linear flow grooves are formed in a straight or curved shape, formed in a mesh type by crossing each other, and formed in a plurality of separate forms.

9. The apparatus of claim 2, wherein cross-sections of the plurality of linear flow grooves are formed in a V-shape or U-shape, and the metal bonding solvent is filled into the plurality of linear flow grooves and the metal bonding solvent flows along a longitudinal direction of the linear flow grooves.

10. The apparatus of claim 9, wherein each of the plurality of linear flow grooves is formed to have a gradient, and wherein each of the plurality of linear flow grooves is formed to have a highest gradient at a center of the loading surface and a lowest gradient closer to an edge of the loading surface.

11. The apparatus of claim 2, wherein the large-area fabricating substrate comprises a plurality of groove lines forming a flow path of the metal bonding solvent applied onto a front surface of the large-area fabricating substrate.

12. The apparatus of claim 11, wherein the plurality of groove lines are formed in first and second directions of the front surface of the large-area fabricating substrate and some areas intersect in the first and second directions to coincide or overlap with each other.

13. The apparatus of claim 12, wherein the plurality of groove lines are formed in a straight shape, formed in a mesh type by crossing each other, and formed in a plurality of separate forms.

14. The apparatus of claim 12, wherein the plurality of groove lines are formed respectively at positions overlapping the plurality of linear flow grooves formed in the loading module to correspond respectively between a plurality of discharge grooves formed in the loading module.

15. The apparatus of claim 1, wherein the element transfer module comprises:

a transfer member in which a pressing header is fixed to a fixing portion of a pressing direction;

a transfer driving member to move the transfer member and the pressing header in the pressing direction or a detaching direction using a fixing frame of the transfer member;

a pressure sensing module between the pressing header and the transfer member to generate pressure detection signals according to a pressure applied to the pressing header;

a gradient setting module to set a gradient of the pressing header based on a magnitude of the pressure detection signals; and a gradient control module to control the gradient of the pressing header, the transfer member, and the fixing frame according to a control of the gradient setting module.

16. The apparatus of claim 15, wherein the pressure sensing module uses a plurality of pressure sensors located in each different position in different directions to sense a magnitude of the pressure applied to the pressing header and generate pressure sensing signals based on the magnitude of the pressure, and wherein the pressure sensing module uses at least one signal transmission circuit to transmit the pressure detection signals with a directional code in respect to each of the plurality of pressure sensors to the gradient setting module.

17. The apparatus of claim 16, wherein the gradient setting module detects a magnitude deviation between the pressure detection signals and calculates horizontal gradient setting values of the pressing header for making the magnitude deviation between the pressure detection signals zero, and generates gradient control signals corresponding to magnitudes of the calculated horizontal gradient setting values to transmit the gradient control signals to the gradient control module.

18. The apparatus of claim 17, wherein the gradient control module adjusts horizontal gradients of a plurality of pressure controllers, the transfer member, and the pressing header formed on a flat plate type support frame by controlling the horizontal gradient of the flat plate type support frame of the transfer driving member based on the gradient control signals.

19. A fabricating method of a display panel, the method comprising:

loading, onto a loading surface of a loading module, a large-area fabricating substrate fabricated and separated into a plurality of display panels;

applying a metal bonding solvent onto the large-area fabricating substrate using a solvent application module; and transferring a plurality of light emitting elements or at least one integrated circuit on the large-area fabricating substrate applied with the metal bonding solvent using an element transfer module, wherein, before transferring the light emitting elements or the at least one integrated circuit, the metal bonding solvent applied on the large-area fabricating substrate flows and is discharged through a groove type discharge path formed in the loading surface.

20. An apparatus for fabricating a display panel, the apparatus comprising:

a loading module of a large-area fabricating substrate fabricated and separated into a plurality of display panels;

a solvent application module configured to apply a metal bonding solvent onto the large-area fabricating substrate; and an element transfer module configured to transfer a plurality of light emitting elements or at least one integrated circuit onto the large-area fabricating substrate on which the metal bonding solvent is applied, wherein the loading module comprises a groove type discharge path through which the metal bonding solvent applied by the solvent application module flows and is discharged, wherein the groove type discharge path comprises:

a plurality of linear flow grooves forming a flow path of the metal bonding solvent;

a plurality of discharge grooves to discharge the metal bonding solvent flowing through the plurality of linear flow grooves; and a plurality of discharge holes formed in a lower direction or a side direction of the plurality of discharge grooves to discharge the metal bonding solvent in the lower or side direction, wherein the plurality of discharge grooves are formed on an end and an opposite end of each of the plurality of linear flow grooves, and wherein the plurality of discharge holes are formed to pass through each of the plurality of discharge grooves in the lower direction or the side direction.

* * * * *